(12) United States Patent
Miyamoto et al.

(10) Patent No.: US 11,384,447 B2
(45) Date of Patent: Jul. 12, 2022

(54) SUBSTRATE HOLDER, PLATING APPARATUS, METHOD FOR MANUFACTURING SUBSTRATE HOLDER, AND METHOD FOR HOLDING SUBSTRATE

(71) Applicant: EBARA CORPORATION, Tokyo (JP)

(72) Inventors: Matsutaro Miyamoto, Tokyo (JP); Yoshitaka Mukaiyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 654 days.

(21) Appl. No.: 16/330,717

(22) PCT Filed: Sep. 7, 2017

(86) PCT No.: PCT/JP2017/032292
§ 371 (c)(1),
(2) Date: Mar. 5, 2019

(87) PCT Pub. No.: WO2018/047908
PCT Pub. Date: Mar. 15, 2018

(65) Prior Publication Data
US 2021/0277534 A1    Sep. 9, 2021

(30) Foreign Application Priority Data

Sep. 8, 2016 (JP) .............................. JP2016-175785
Sep. 29, 2016 (JP) .............................. JP2016-191003

(51) Int. Cl.
*H01L 21/687* (2006.01)
*C25D 17/06* (2006.01)

(52) U.S. Cl.
CPC ........ *C25D 17/06* (2013.01); *H01L 21/68721* (2013.01)

(58) Field of Classification Search
CPC ...... B05C 3/10; B65G 49/0477; C25D 17/06; H01L 21/68721
See application file for complete search history.

(56) References Cited

U.S. PATENT DOCUMENTS 6,844,274 B2    1/2005  Yoshioka et al.
10,316,425 B2*  6/2019  Yajima .................. C25D 17/06
(Continued)

FOREIGN PATENT DOCUMENTS

CN    104674328 A    6/2015
CN    104781453 A    7/2015
(Continued)

OTHER PUBLICATIONS

International Patent Application No. PCT/JP2017/032292; Int'l Search Report; dated Oct. 17, 2017; one page.

*Primary Examiner* — Saul Rodriguez
*Assistant Examiner* — Brendan P Tighe
(74) *Attorney, Agent, or Firm* — BakerHostetler

(57) ABSTRACT

Provided is a substrate holder including a first holding member and a second holding member configured to sandwich and fix a substrate, wherein the first holding member includes a first holding member body, and a clamp provided on the first holding member body, the clamp being rotatable about a shaft extending parallel to a surface of the first holding member body, or being reciprocable in a direction intersecting with the surface of the first holding member body, the second holding member includes a second holding member body, and the clamp is capable of engaging with the second holding member in a state where the first holding member body and the second holding member body are brought into contact with each other, to fix the second holding member to the first holding member.

29 Claims, 39 Drawing Sheets

(56) References Cited

U.S. PATENT DOCUMENTS

| | | | |
|---|---|---|---|
| 10,577,713 B2* | 3/2020 | Miyamoto | C25D 17/004 |
| 10,953,504 B2* | 3/2021 | Schumacher | A61C 13/0022 |
| 2002/0029963 A1* | 3/2002 | Yoshioka | C25D 17/001 |
| | | | 204/224 R |
| 2003/0026065 A1* | 2/2003 | Suhara | H01L 21/68778 |
| | | | 361/600 |
| 2004/0037682 A1* | 2/2004 | Yoshioka | C25D 7/123 |
| | | | 414/458 |
| 2005/0014368 A1* | 1/2005 | Yoshioka | C25D 21/12 |
| | | | 438/689 |
| 2006/0191786 A1 | 8/2006 | Yamamoto et al. | |
| 2009/0245983 A1* | 10/2009 | Law | C25D 17/06 |
| | | | 414/226.04 |
| 2012/0043200 A1* | 2/2012 | Fujikata | C25D 17/06 |
| | | | 204/242 |
| 2013/0001073 A1 | 1/2013 | Noda et al. | |
| 2013/0192983 A1* | 8/2013 | Fujikata | C25D 17/001 |
| | | | 204/297.14 |
| 2013/0255360 A1* | 10/2013 | Minami | C25D 17/004 |
| | | | 73/40.5 R |
| 2014/0042032 A1 | 2/2014 | Shimoyama et al. | |
| 2014/0245954 A1* | 9/2014 | Minami | C23C 18/1675 |
| | | | 204/267 |
| 2014/0295093 A1* | 10/2014 | Hirao | C23C 18/1632 |
| | | | 204/198 |
| 2014/0314957 A1* | 10/2014 | Minami | C25D 21/08 |
| | | | 427/352 |
| 2015/0090584 A1* | 4/2015 | Minami | C25D 21/08 |
| | | | 204/198 |
| 2015/0276835 A1* | 10/2015 | Minami | C25D 7/12 |
| | | | 702/65 |
| 2015/0294894 A1 | 10/2015 | Yoshioka et al. | |
| 2016/0108539 A1* | 4/2016 | Yahagi | C25D 17/001 |
| | | | 269/287 |
| 2016/0319456 A1* | 11/2016 | Yoshioka | C25D 7/12 |
| 2016/0348264 A1* | 12/2016 | Fujikata | C25D 17/02 |
| 2017/0350033 A1* | 12/2017 | Fujikata | H01L 21/67253 |
| 2018/0182659 A1* | 6/2018 | Yokoyama | H01L 21/68764 |
| 2019/0105689 A1* | 4/2019 | Kubota | B08B 3/108 |
| 2019/0203373 A1* | 7/2019 | Fujikata | H01L 21/68707 |

FOREIGN PATENT DOCUMENTS

| | | |
|---|---|---|
| JP | 2000-150421 A | 5/2000 |
| JP | 2006-233296 A | 9/2006 |
| JP | 4179707 B | 11/2008 |
| JP | 2009-270167 A | 11/2009 |
| JP | 2014-053594 A | 3/2014 |
| JP | 2014-214332 A | 11/2014 |
| JP | 2016-117917 A | 6/2016 |
| KR | 2009-0132090 A | 12/2009 |

* cited by examiner

SUBSTRATE HOLDER, PLATING APPARATUS, METHOD FOR MANUFACTURING SUBSTRATE HOLDER, AND METHOD FOR HOLDING SUBSTRATE

TECHNICAL FIELD

The present invention relates to a substrate holder, a plating apparatus, a method for manufacturing a substrate holder, and a method for holding a substrate.

BACKGROUND ART

Conventionally, wirings, bumps (protruding electrodes) and the like are formed on a surface of a substrate such as a semiconductor wafer or a printed circuit board. An electrolytic plating method is used as a method for forming the wirings, the bumps and the like.

A plating apparatus, which is used in the electrolytic plating method, includes a substrate holder which seals an end surface of a substrate having a circular shape or a polygonal shape, and holds the substrate with a surface (surface to be plated) of the substrate exposed. In performing plating treatment on the surface of the substrate in such a plating apparatus, the substrate holder holding the substrate is immersed into a plating solution.

Japanese Patent Laid-Open No. 2016-117917 (PTL 1) describes a substrate holder for a semiconductor wafer. This substrate holder is configured such that a substrate placed on a fixed holding member (first holding member 22) is sandwiched between the fixed holding member and a movable holding member (second holding member 24), and a press ring 27 on the second holding member 24 is rotated so as to be engaged with dampers 33 on the first holding member 22, thus fixing a substrate to the substrate holder.

Japanese Patent No. 4179707 (PTL 2) describes a board holding jig for holding a printed circuit board having a quadrangular shape. In this board holding jig, a printed circuit board P is fixed by four grip members 30 provided on a rectangular frame 20.

Japanese Patent Laid-Open No. 2009-270167 (PTL 3) describes a plating apparatus where a substrate is transported in a horizontal state, and plating treatment is performed on the substrate in a state of being horizontally held on a holding base 42 of a plating unit 26.

Further, in performing electroplating, power is supplied to a substrate through contacts on a substrate holder during plating treatment. A technique has been studied where a plurality of contacts are provided on the substrate holder so as to acquire favorable in-plane uniformity in thickness of a plating metal film in performing plating treatment mainly with respect to substrates having a circular shape. Poor contact between a power supply terminal and an external connection contact may vary an electrical resistance between the power supply terminal and the external connection contact. As a result, there may be a case where a non-uniform electric current flows into an inner contact through the external connection contact. Particularly, recently, there is a trend to reduce the thickness of conductive layers. There is also a trend to increase density of current which is made to flow into a substrate W. Accordingly, even slight variations in electrical resistance between the external connection contacts may significantly deteriorate uniformity in film thickness of a metal film to be formed on a surface of the substrate. In view of the above, it may be considered to form a plurality of external connection contacts using an integral member. In this case, electrical resistances of the respective external connection contacts cannot be measured before plating is performed on a substrate. Accordingly, in the case where a plurality of contacts are provided, recently, adoption of a method has been considered where confirmation of reliable power supply is made before plating treatment is performed, that is, so-called conduction confirmation processing is performed (PTL 4). With this method, the contacts which form a pair are provided in an independent state, and a plurality of pairs of contacts are provided so that conduction confirmation can be favorably performed with certainty.

CITATION LIST

Patent Literature

PTL 1: Japanese Patent Laid-Open No. 2016-117917
PTL 2: Japanese Patent No. 4179707
PTL 3: Japanese Patent Laid-Open No. 2009-270167
PTL 4: Japanese Patent Laid-Open No. 2016-117917

SUMMARY OF INVENTION

Technical Problem

The configuration described in PTL 1 is provided for performing plating treatment on a semiconductor wafer having a circular shape. Recently, however, there is a demand for performing plating treatment on substrates having a variety of sizes, shapes, and thicknesses. Particularly, when a substrate having a large size and a small thickness is held by the substrate holder disclosed in PTL 1, the substrate may be deflected due to the rotation of the press ring.

In the board holding jig described in PTL 2, a board is fixed by the grip members 30 by fixing a pair of blocks 31, 32 of each grip member 30 by a screw in a state where end portions of the board are sandwiched between both blocks. However, this configuration is not suitable for automating the holding of a board by the board holding jig.

PTL 3 describes the configuration where a glass substrate is transported through the apparatus so as to perform processing with a surface to be treated of the glass substrate facing upward and hence, it is unnecessary to provide a complicated posture change mechanism, thus realizing a reduction in size of the apparatus. However, in the case where treatment is performed on a substrate having a smaller thickness than the glass substrate, thus having a warp, when the substrate is transported with a surface to be treated of the substrate facing upward, a flaw may be generated on the surface of the substrate, or the substrate may be damaged.

On the other hand, it has been realized that the substrate holder described in Japanese Patent Laid-Open No. 2016-117917 (PTL 4) which has been used in performing plating treatment on a substrate having a circular shape cannot be used in performing plating treatment on a substrate having a quadrangular shape, for example, if no modifications are made.

For example, to perform plating treatment on a substrate having a quadrangular shape while favorable in-plane uniformity is maintained, it is required to properly control positions of the contacts, and an amount of power to be supplied. Further, when the size of a substrate, which is a treatment target, increases, it is also necessary to increase the number of contacts, and the number of cables to be connected to the contacts.

In some cases, to increase an amount of power to be supplied to a substrate, it becomes necessary to increase an amount of electric current which passes through the cables connected to specific contacts. In general, it is necessary to increase the diameter of the cables to increase the amount of electric current. However, an increase in the number of cables and/or an increase in diameter of the cables increase the size of the substrate holder. Accordingly, there is a possibility that difficulties occur in transportation or the like of the substrate holder in some cases.

It is an object of the present invention to solve at least a portion of the above-mentioned problems.

Solution to Problem

[1] According to one aspect of the present invention, there is provided a substrate holder including: a first holding member and a second holding member configured to sandwich and fix a substrate, wherein the first holding member includes a first holding member body, and a clamp provided on the first holding member body, the clamp being rotatable about a shaft extending parallel to a surface of the first holding member body, or being reciprocable in a direction intersecting with the surface of the first holding member body, the second holding member includes a second holding member body, and the clamp is capable of engaging with the second holding member in a state where the first holding member body and the second holding member body are brought into contact with each other, to fix the second holding member to the first holding member.

[2] According to another aspect of the present invention, there is provided a plating apparatus which includes a substrate holder configured to hold a substrate, and a plating tank configured to receive the substrate holder so as to perform plating treatment on the substrate. The substrate holder includes a first holding member and a second holding member which sandwich and fix the substrate. The first holding member includes a first holding member body, and a clamp provided on the first holding member body, the clamp being rotatable about a shaft extending parallel to a surface of the first holding member body, or being reciprocable in a direction intersecting with the surface of the first holding member body. The second holding member includes a second holding member body. The clamp is configured to be engaged with the second holding member so as to press the second holding member toward the first holding member side in a state where the first holding member body and the second holding member body are brought into contact with each other.

[3] According to still another aspect of the present invention, there is provided a method for holding a substrate, the method including the steps of: sandwiching the substrate between a first holding member and a second holding member, and fixing the second holding member by a clamp so as to be pressed toward the first holding member, the clamp being rotatable about a shaft extending parallel to a surface of the first holding member, or being reciprocable in a direction intersecting with the surface of the first holding member.

[4] According to still another aspect of the present invention, there is provided a substrate holder including a first holding member and a second holding member configured to sandwich a substrate, wherein the first holding member includes: a first holding member body; at least one cable having one end portion from which a cover is removed; at least one first conductive member configured to be electrically contactable with the substrate; and a sandwiching member provided on the first holding member body, and configured to sandwich the one end portion of the cable together with the first conductive member or a second conductive member which is electrically coupled to the first conductive member.

[5] According to still another aspect of the present invention, there is provided a plating apparatus including: a substrate holder configured to hold a substrate; and a plating tank configured to receive the substrate holder so as to perform plating treatment on the substrate, wherein the substrate holder includes a first holding member, and the first holding member includes: a first holding member body; at least one cable having one end portion from which a cover is removed; at least one first conductive member configured to be electrically contactable with the substrate; and a sandwiching member provided on the first holding member body, and configured to sandwich the one end portion of the cable together with the first conductive member or a second conductive member which is electrically coupled to the first conductive member.

[6] According to still another aspect of the present invention, there is provided a method for manufacturing a substrate holder, the method including the steps of: disposing at least one cable having one end portion from which a cover is removed on a first holding member for holding a substrate; and sandwiching the one end portion of the cable by a sandwiching member together with at least one first conductive member configured to be electrically contactable with the substrate, or a second conductive member which is electrically coupled to the first conductive member, thus establishing an electrical connection between the cable and the first conductive member.

DESCRIPTION OF EMBODIMENTS

Hereinafter, embodiments of the present invention are described with reference to drawings. In the respective embodiments described hereinafter, identical or corresponding members are given the same symbols, and the repeated description is omitted. In this specification, the descriptions such as "front surface", "back surface", "front", "back", "up", "down", "left" and "right" are used. These descriptions merely describe positions and directions on a paper on which a drawing is illustrated for the sake of convenience of the description, and may differ from positions and directions of an apparatus in an actual arrangement such as an arrangement when the apparatus is in use.

Figure 1:
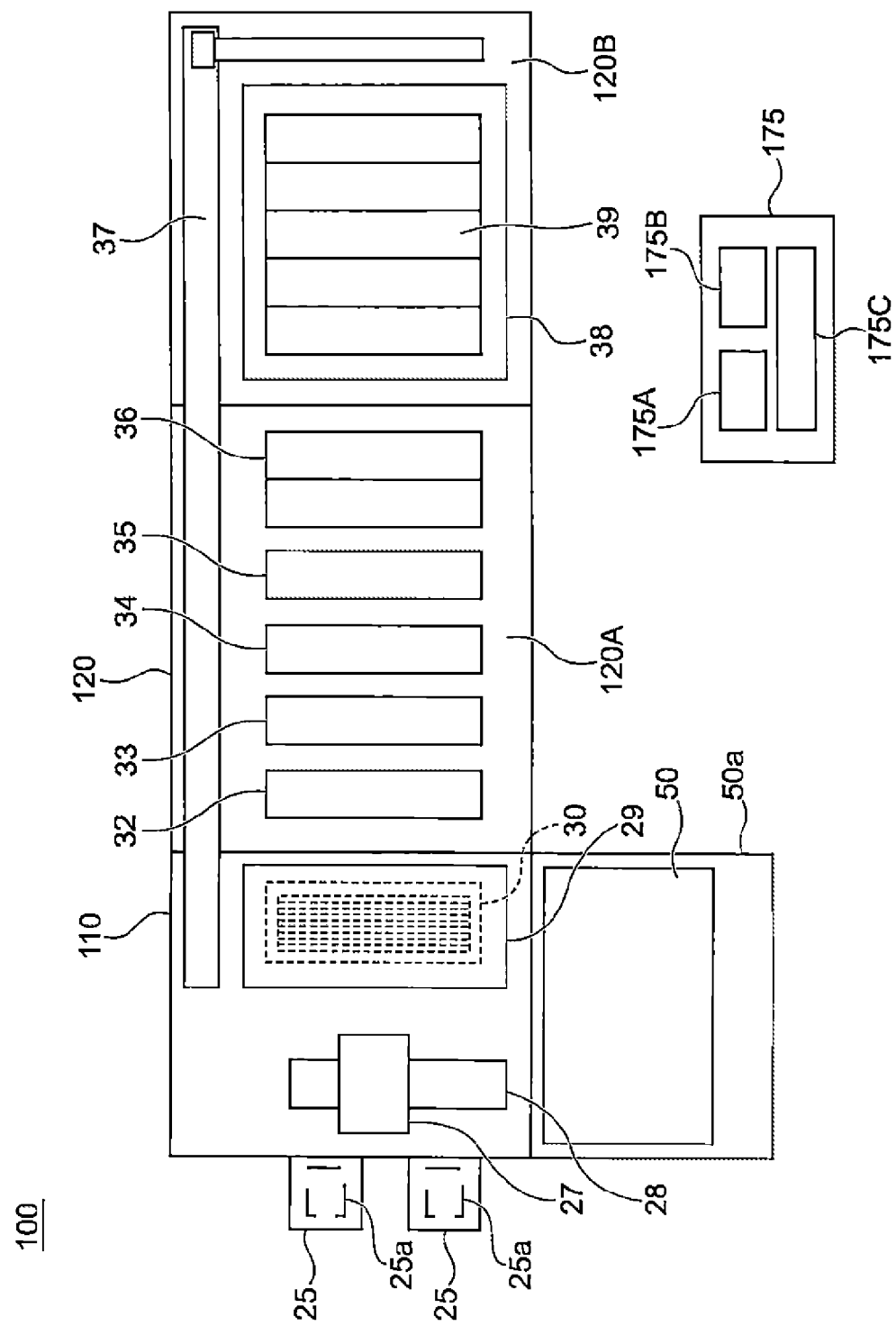
FIG. 1 is an overall layout diagram of a plating apparatus in which a substrate holder according to one embodiment of the present invention is used.

FIG. 1 is an overall layout diagram of a plating apparatus in which a substrate holder according to one embodiment of the present invention is used. As shown in FIG. 1, the plating apparatus 100 is roughly divided into a loading/unloading unit 110 where a substrate (corresponding to one example of an object to be treated) is loaded on the substrate holder 1, or the substrate is unloaded from the substrate holder 1; a treatment unit 120 where treatment is performed on the substrate; and a cleaning part 50a. The treatment unit 120 includes: a pretreatment and post-treatment unit 120A where pretreatment and post-treatment are performed on a substrate; and a plating treatment unit 120B where plating treatment is performed on the substrate. A substrate, on which treatment is performed in the plating apparatus 100, includes a quadrangular substrate and a circular substrate. The quadrangular substrate includes a glass substrate, a liquid crystal substrate and a printed circuit board which have a polygonal shape such as a rectangular shape, and other objects to be plated having a polygonal shape. The circular substrate includes a semiconductor wafer, a glass substrate, and other objects to be plated having a circular shape.

The loading/unloading unit 110 includes two cassette tables 25 and a substrate loading and unloading mechanism 29. Each cassette table 25 mounts cassettes 25a storing substrates such as semiconductor wafers, glass substrates, liquid crystal substrates or printed circuit boards thereon. The substrate loading and unloading mechanism 29 is configured to load and unload a substrate to and from the substrate holder 1 (described later with reference to FIG. 2A and following drawings). A stocker 30 for storing the substrate holders 1 is disposed in the vicinity of the substrate loading and unloading mechanism 29 (below the substrate loading and unloading mechanism 29, for example). A substrate transferring device 27, which is a transfer robot, is disposed at the center of these units 25, 29, 30, and the substrate transferring device 27 transfers a substrate between these units. The substrate transferring device 27 is configured to be travelable by a traveling mechanism 28.

The cleaning part 50a includes a cleaning device 50 for cleaning and drying a substrate on which plating treatment is performed. The substrate transferring device 27 is configured to transfer the substrate on which plating treatment is performed to the cleaning device 50, and to extract the cleaned substrate from the cleaning device 50.

The pretreatment and post-treatment unit 120A includes: a pre-wetting tank 32; a presoaking tank 33; a pre-rinse tank 34; a blow tank 35; and a rinse tank 36. A substrate is immersed into pure water in the pre-wetting tank 32. An oxide film on a surface of a conductive layer such as a seed layer formed on a surface of the substrate is removed by etching in the presoaking tank 33. The substrate, on which pre-soaking treatment is performed, is cleaned with a cleaning solution (pure water or the like) together with the substrate holder in the pre-rinse tank 34. The cleaned substrate is drained in the blow tank 35. The substrate, to which plating is applied, is cleaned with a cleaning solution together with the substrate holder in the rinse tank 36. The pre-wetting tank 32, the presoaking tank 33, the pre-rinse tank 34, the blow tank 35, and the rinse tank 36 are disposed in this order. The above-mentioned configuration of the pretreatment and post-treatment unit 120A of the plating apparatus 100 is merely one example. The pretreatment and post-treatment unit 120A of the plating apparatus 100 is not particularly limited to such a configuration, and may adopt other configurations.

The plating treatment unit 120B includes a plurality of plating tanks 39 including an overflow tank 38. Each plating tank 39 stores one substrate therein. The substrate is immersed into a plating solution held in the inside of each plating tank 39 so as to apply plating such as copper plating to a surface of the substrate. A kind of plating solution is not particularly limited, and any of various plating solutions may be used corresponding to the application.

The plating apparatus 100 includes a substrate holder transporting device 37 of a linear motor type, for example. The substrate holder transporting device 37 is positioned on a side facing the respective equipment, and transports a substrate holder together with a substrate between the respective equipment. The substrate holder transporting device 37 is configured to transport a substrate holder between the substrate loading and unloading mechanism 29, the pre-wetting tank 32, the presoaking tank 33, the pre-rinse tank 34, the blow tank 35, the rinse tank 36, and the plating tank 39.

A plating treatment system which includes the plating apparatus 100 having the above-mentioned configuration includes a controller 175 configured to control the above-mentioned respective parts. The controller 175 includes: a memory 175B storing a predetermined program; a CPU (Central Processing Unit) 175A which executes the program in the memory 175B; and a control part 175C which is realized when the program is executed by the CPU 175A. For example, the control part 175C can perform controls such as a transfer control of the substrate transferring device 27, a control of loading and unloading a substrate to and from a substrate holder performed by the substrate loading and unloading mechanism 29, a transport control of the substrate holder transporting device 37, a control of a plating current and a plating time in the respective plating tanks 39, and a control of an opening diameter of an anode mask (not shown in the drawing) disposed in the respective plating tanks 39 and an opening diameter of a regulation plate (not shown in the drawing) disposed in the respective plating tanks 39. The controller 175 is configured to be communicable with a host controller not shown in the drawing which performs a centralized control of the plating apparatus 100 and other related devices. Accordingly, the controller 175 can transmit and receive data to and from a database which the host controller includes. In this embodiment, a storage medium which forms the memory 175B stores various kinds of setting data and a various kinds of programs such as plating treatment program described later. As a storage medium, a known storage medium may be used, which includes a computer readable memory such as a ROM and a RAM, and a disk-shaped storage medium such as a hard disk, a CD-ROM, a DVD-ROM or a flexible disk.

[Substrate Holder]

Figure 2A:
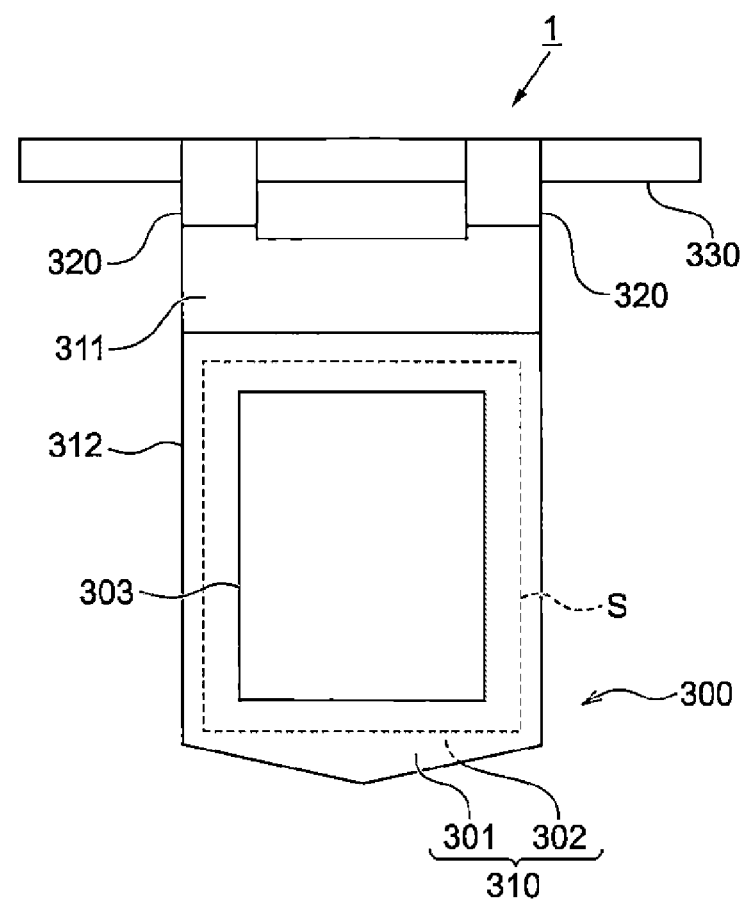
FIG. 2A is a schematic front view of the substrate holder according to one embodiment.
Figure 2B:
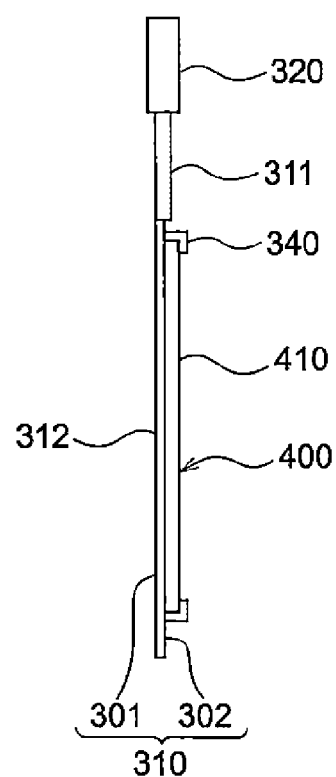
FIG. 2B is a schematic side view of the substrate holder.
Figure 2C:
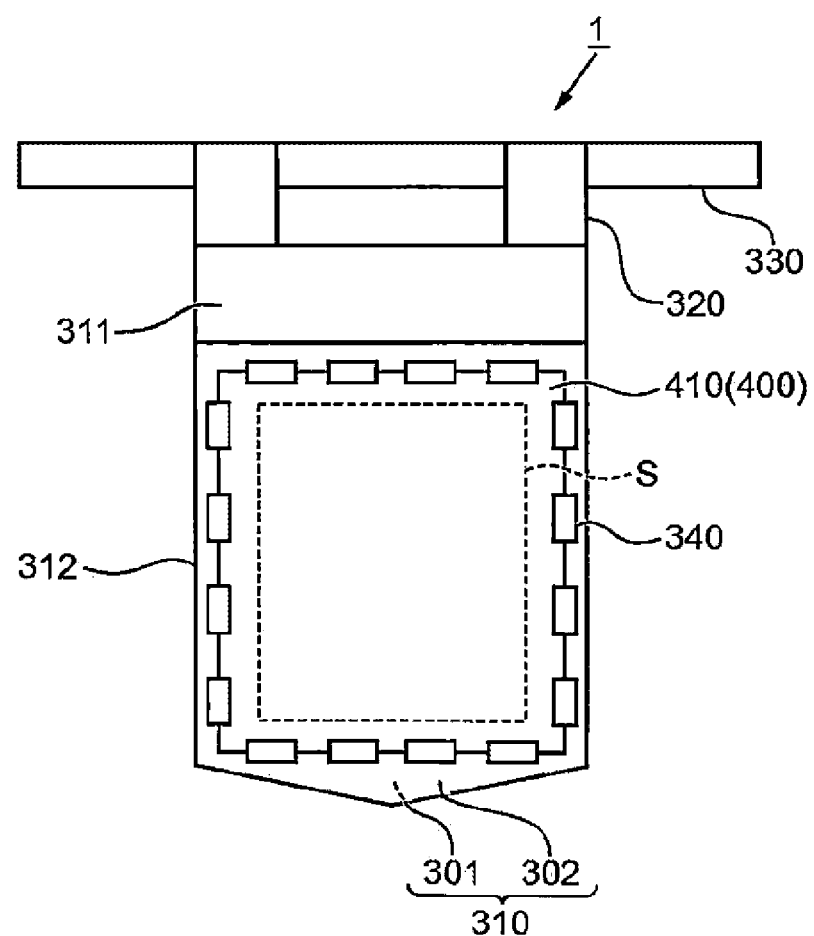
FIG. 2C is a schematic back view of the substrate holder.
Figure 3A:
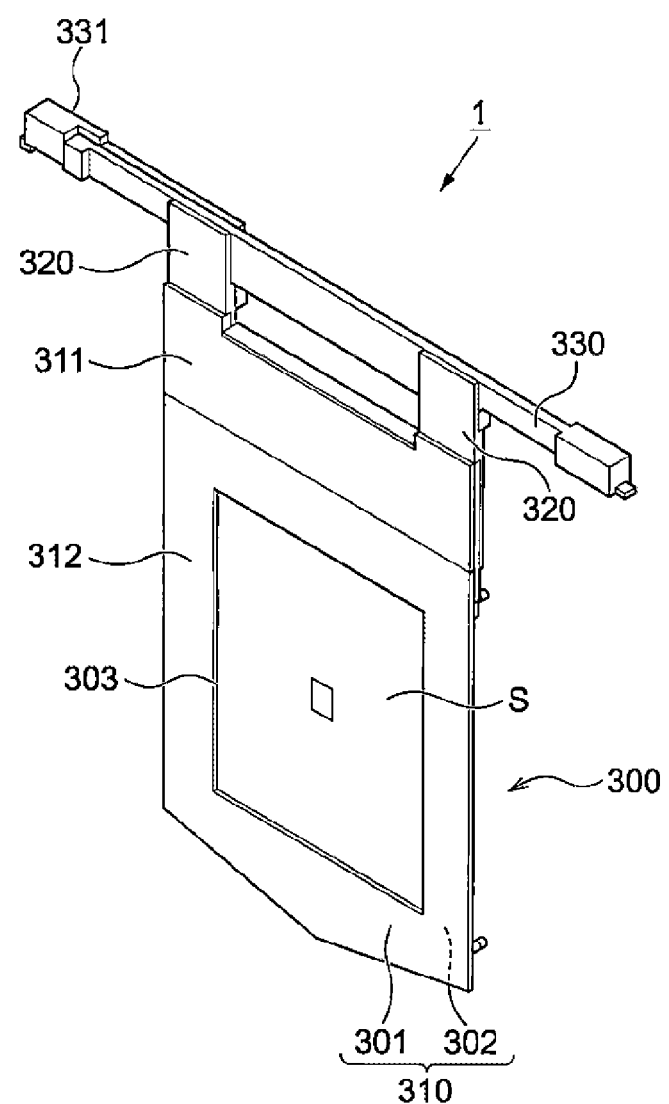
FIG. 3A is a front perspective view of the substrate holder.
Figure 3B:
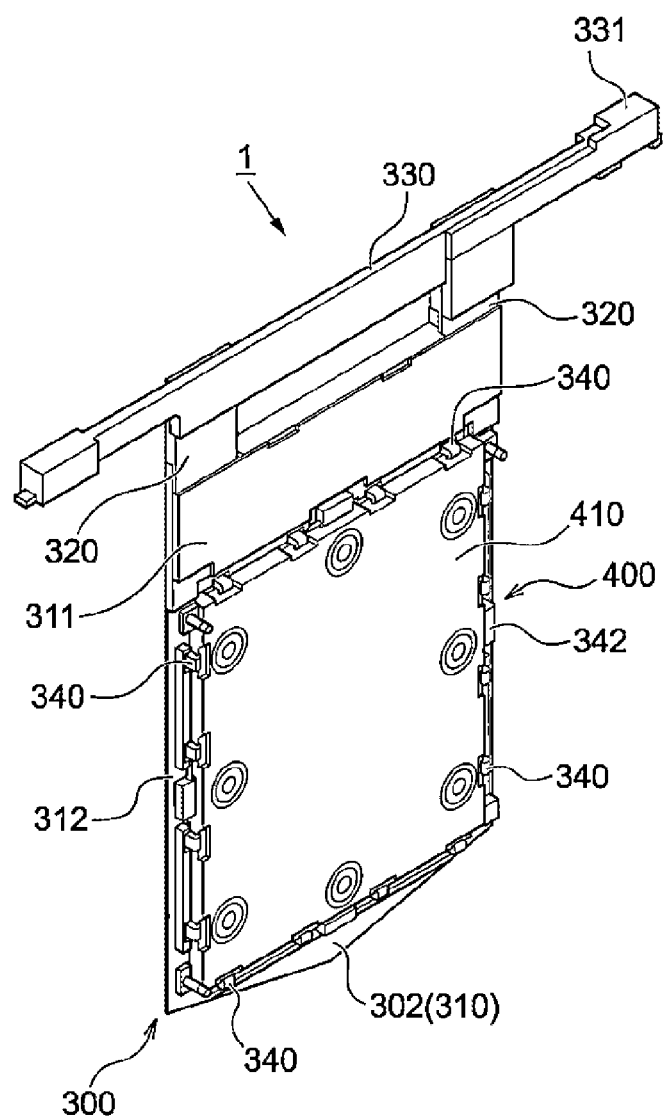
FIG. 3B is a rear perspective view of the substrate holder.
Figure 4A:
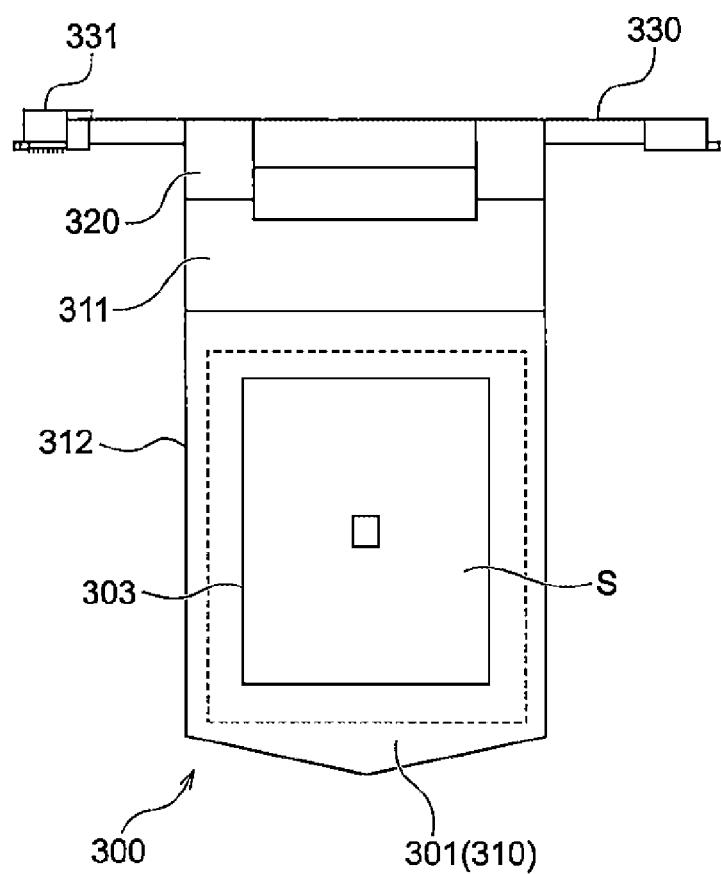
FIG. 4A is a front view of the substrate holder.
Figure 4B:
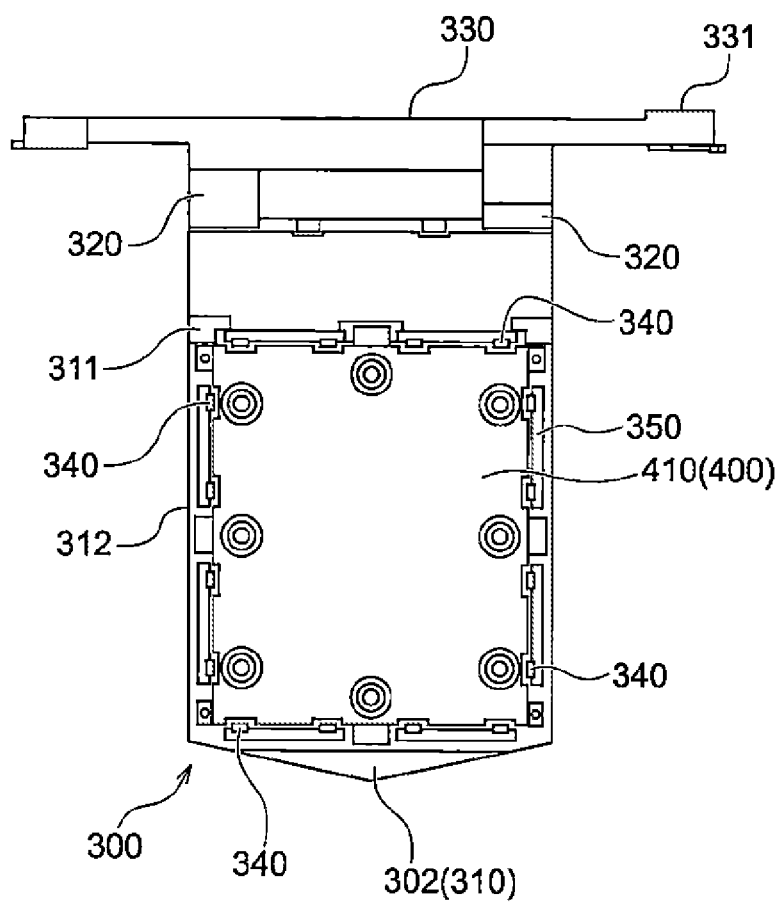
FIG. 4B is a back view of the substrate holder.

FIG. 2A is a schematic front view of the substrate holder according to one embodiment. FIG. 2B is a schematic side view of the substrate holder. FIG. 2C is a schematic back view of the substrate holder. FIG. 3A is a front perspective view of the substrate holder. FIG. 3B is a rear perspective view of the substrate holder. FIG. 4A is a front view of the substrate holder. FIG. 4B is a back view of the substrate holder.

The substrate holder 1 includes a front plate 300 and a back plate 400. A substrate S is held between the front plate 300 and the back plate 400. In this embodiment, the substrate holder 1 holds the substrate S with one surface of the substrate S exposed. The substrate S may be a semiconductor wafer, a glass substrate, a liquid crystal substrate, a printed circuit board or any other object to be plated. The substrate S may have any shape such as a circular shape or a quadrangular shape. In the description made hereinafter, the description is made by taking a substrate having a quadrangular shape as an example. However, a change in shape of an opening portion of the substrate holder 1 allows the substrate holder 1 to hold a substrate having a circular shape or another shape.

The front plate 300 includes a front plate body 310 and an arm portion 330. The arm portion 330 is a grip portion gripped by the substrate holder transporting device 37, and is also a portion to be supported when disposed in the plating tank 39. The substrate holder 1 is transported in a vertically standing state with respect to an installation surface of the plating apparatus 100, and the substrate holder 1 is disposed in the plating tank 39 in a vertically standing state.

The front plate body 310 has a substantially rectangular shape. The front plate body 310 includes a wiring buffer portion 311 and a face portion 312, and has a front surface 301 and a back surface 302. The front plate body 310 is attached to the arm portion 330 by way of two mounting portions 320. An opening portion 303 is formed on the front plate body 310 so that a surface to be plated of the substrate S is exposed through the opening portion 303. In this embodiment, the opening portion 303 is formed into a rectangular shape corresponding to the substrate S having a rectangular shape. When the substrate S is a semiconductor wafer or the like having a circular shape, the opening portion 303 is also formed into a circular shape.

The wiring buffer portion 311 is disposed at a portion of the front plate body 310 on a side close to the arm portion 330. The wiring buffer portion 311 is a region where cables are distributed which reach the front plate body 310 through the arm portion 330. The wiring buffer portion 311 is also a region where cables of extra length are accommodated. The wiring buffer portion 311 is formed with a thickness slightly larger than a thickness of other portions of the front plate body 310 (face portion 312) (see FIG. 2B). In this embodiment, the wiring buffer portion 311 is formed as a separate body from other portions of the front plate body 310 (face portion 312), and is attached to the face portion 312. A connector 331 is provided at one end side of the arm portion 330 for being electrically connected to external wirings (see FIG. 3A and the like). The back plate 400 is fixed to the back surface 302 of the front plate body 310 (to be more specific, the face portion 312) by clamps 340 (FIG. 2C, FIG. 3B and FIG. 4B).

(Structure for Mounting Back Plate on Front Plate)

Figure 5A:
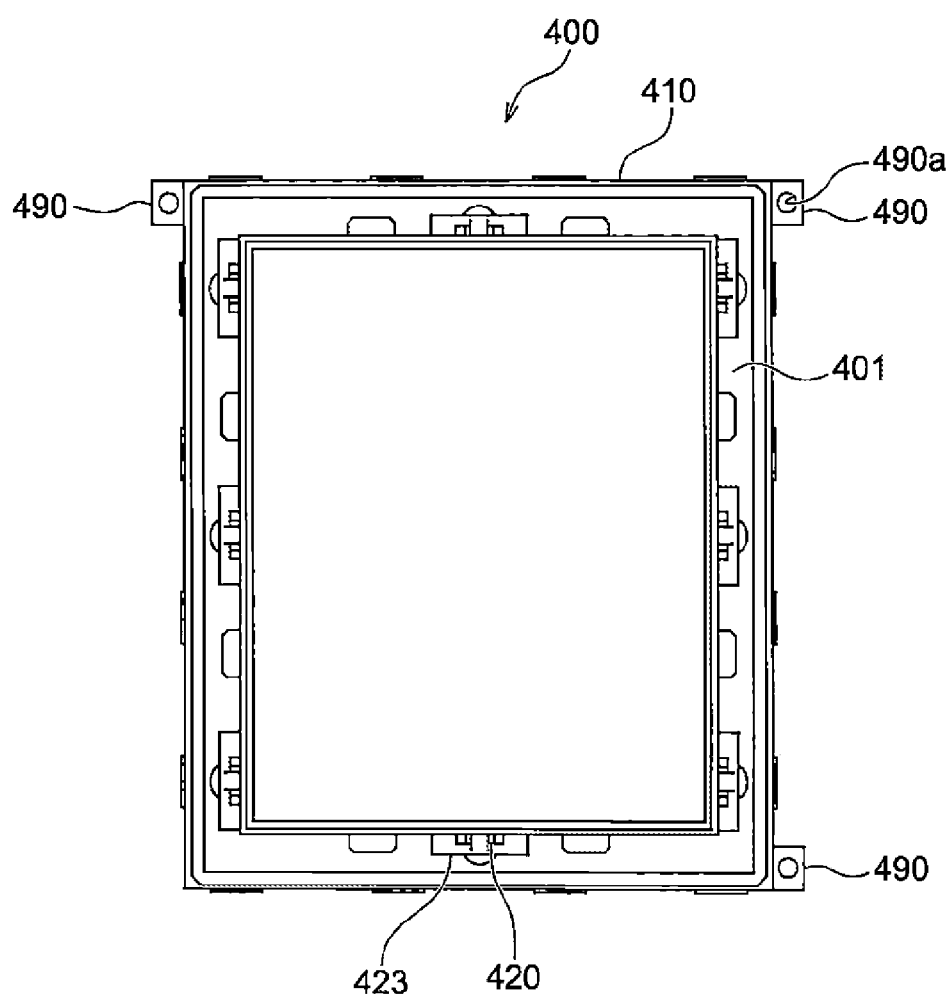
FIG. 5A is a front view of a back plate.
Figure 5B:
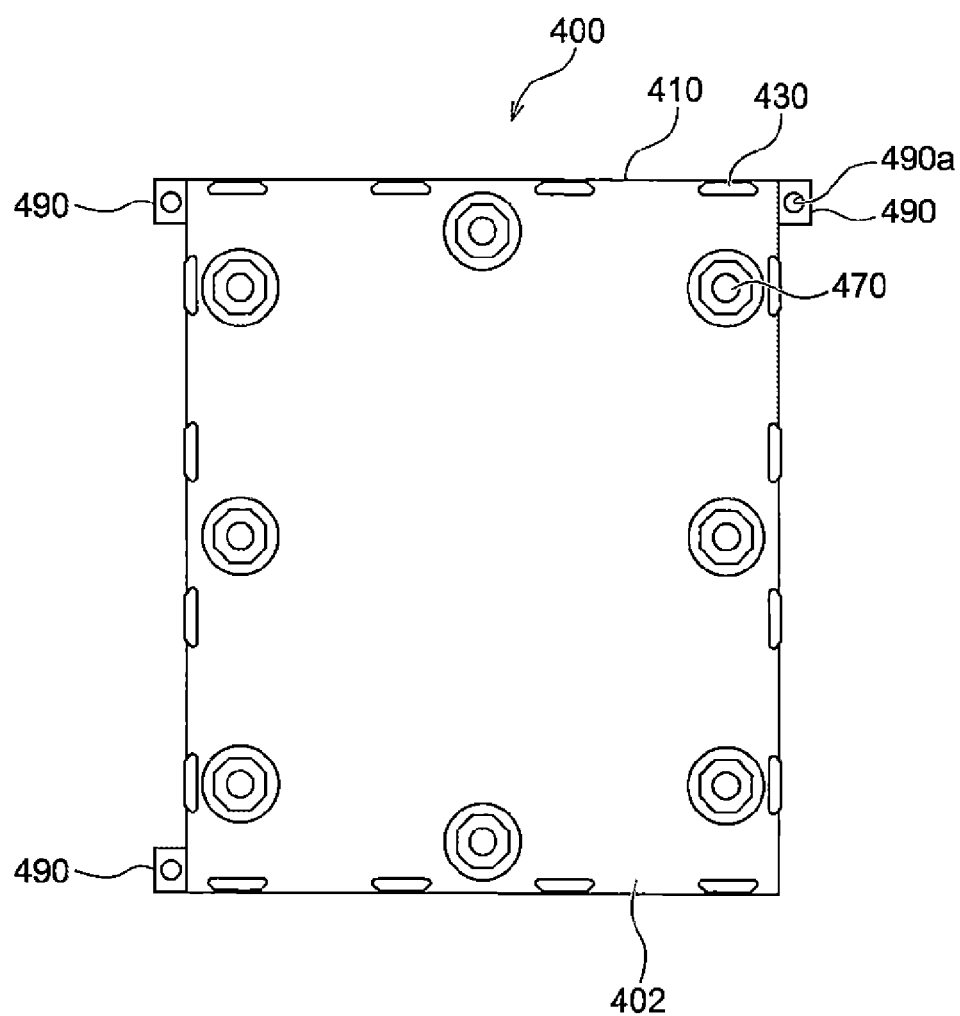
FIG. 5B is a back view of the back plate.
Figure 6A:
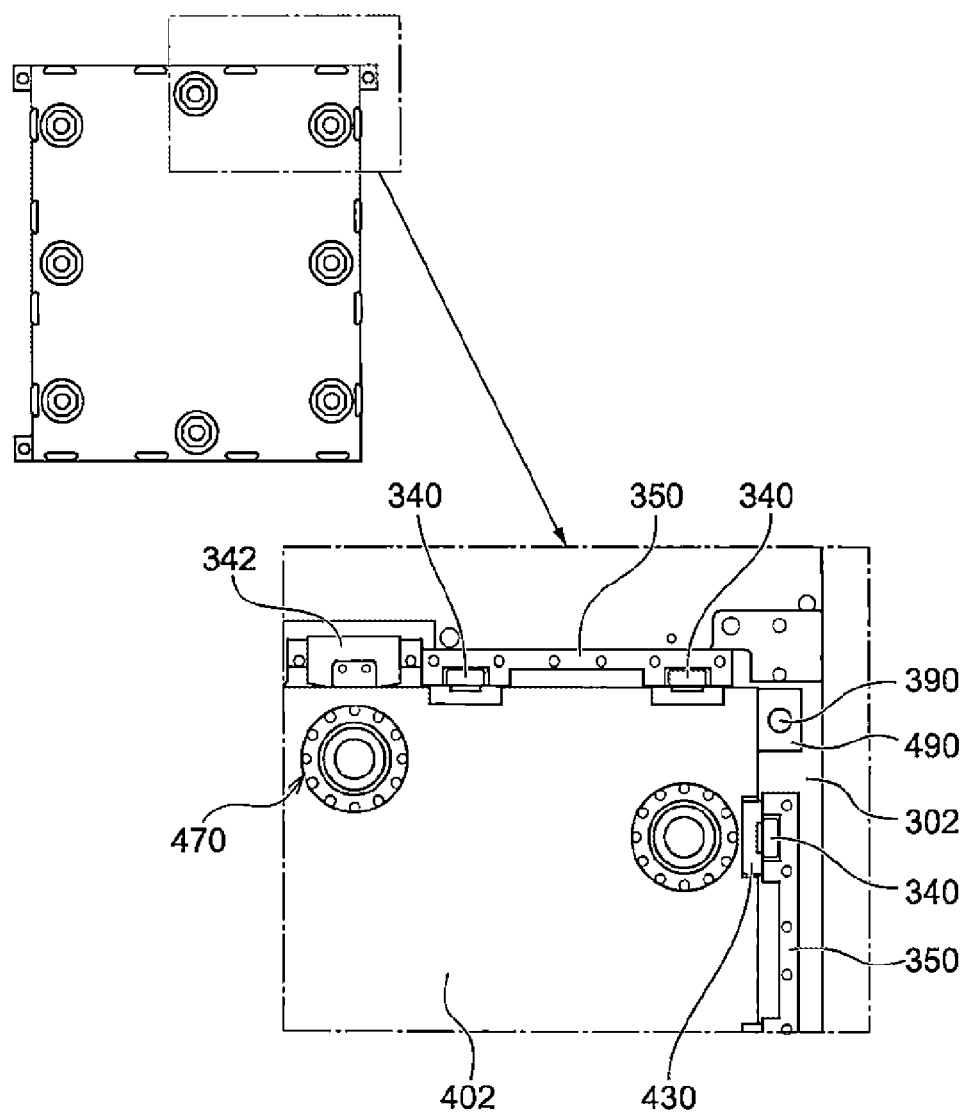
FIG. 6A is a partially enlarged back view of the substrate holder showing an attached state of the back plate.
Figure 6B:
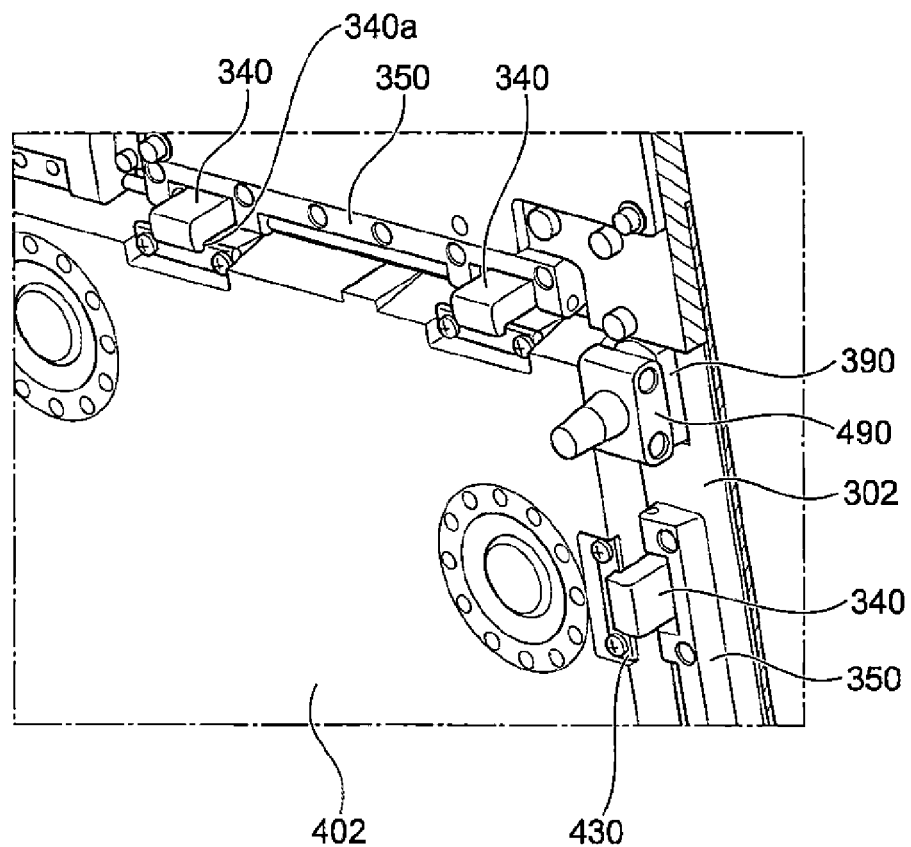
FIG. 6B is a partially enlarged perspective view of the substrate holder showing an attached state of the back plate.
Figure 7:
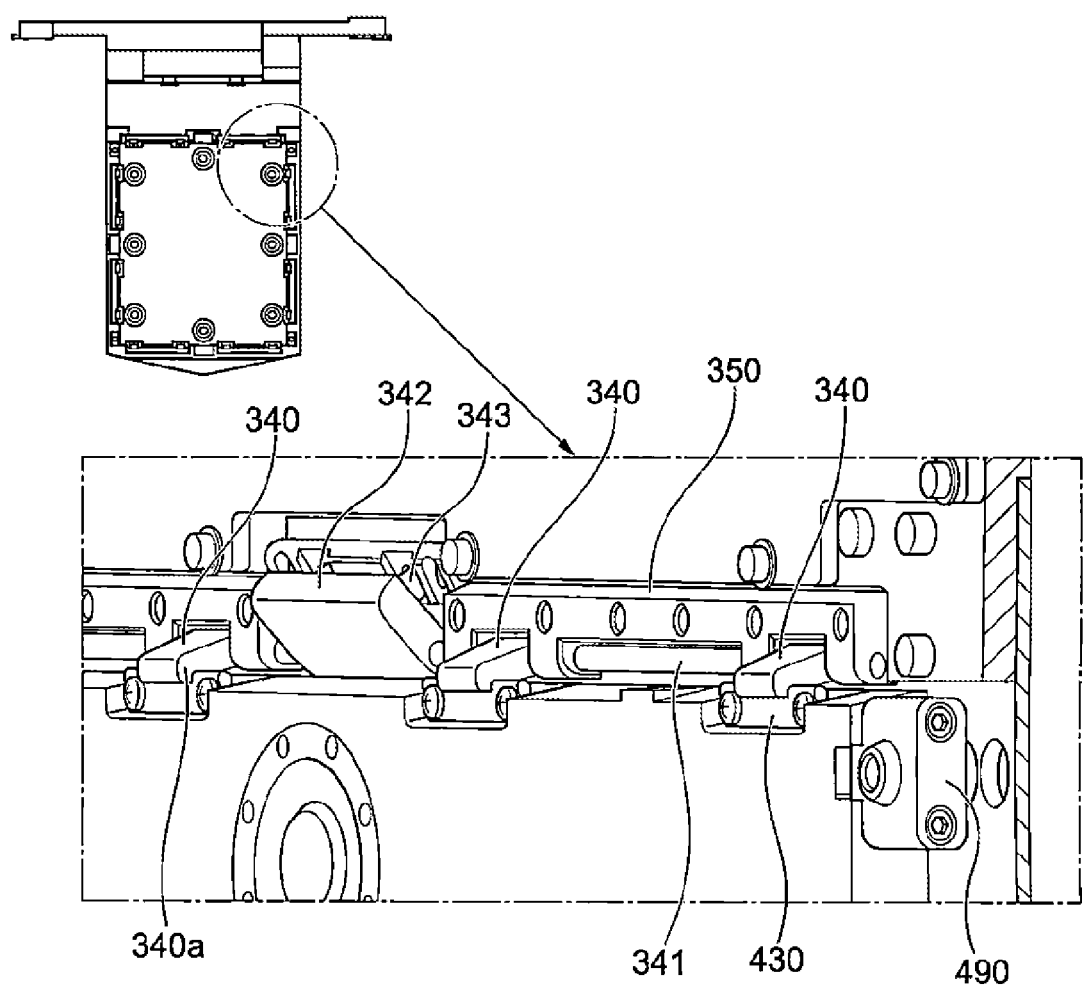
FIG. 7 is a perspective view showing a relationship between clamps and a connecting member.

FIG. 5A is a front view of the back plate. FIG. 5B is a back view of the back plate. FIG. 6A is a partially enlarged back view of the substrate holder showing an attached state of the back plate. FIG. 6B is a partially enlarged perspective view of the substrate holder showing an attached state of the back plate. FIG. 7 is a perspective view showing a relationship between the clamps and a connecting member.

The back plate 400 includes a back plate body 410. The back plate body 410 has a substantially rectangular shape, and has a size smaller than the front plate body 310 of the front plate 300 (FIG. 3B, FIG. 4B). The back plate body 410 has a front surface 401 (FIG. 5A) and a back surface 402 (FIG. 5B).

The front surface 401 of the back plate body 410 forms a surface on which a substrate S is placed, and the front surface 401 is attached to the back surface 302 of the front plate body 310. Eight clip portions 420 in total are provided on the front surface 401 of the back plate body 410 corresponding to respective sides of the substrate S so as to hold (fix) the substrate S. In this embodiment, one clip portion 420 is provided for an upper side and a lower side of the substrate S, and three clip portions 420 are provided for a left side and a right side of the substrate S respectively. The number and the arrangement of the clip portions 420 may be suitably selected corresponding to a size and a shape of the substrate S, and are not limited to the number and the arrangement of the clip portions 420 shown in the drawings.

Positioning pieces 490 are formed on three corners out of four corners of the back plate body 410. A through hole 490a is formed in each positioning piece 490. The positioning pieces 490 may be integrally formed with the back plate body 410. Alternatively, the positioning pieces 490 may be formed as separate bodies from the back plate body 410, and may be attached to the back plate body 410. Positioning pins 390 are formed on the back surface 302 of the front plate body 310 at positions corresponding to respective positioning pieces 490 (FIG. 6A and FIG. 6B). The positioning pins 390 may be integrally formed with the front plate body 310. Alternatively, the positioning pins 390 may be formed as separate bodies from the front plate body 310, and may be attached to the front plate body 310. In mounting the back plate 400 on the front plate 300, the positioning pins 390 are inserted into the through holes 490a of the positioning pieces 490 of the back plate 400 so as to position both the front plate 300 and the back plate 400.

As shown in FIG. 4B, fixing members 350 are disposed on the back surface 302 of the front plate 300 corresponding to four respective sides of the back plate 400. Two fixing members 350 are provided for each one side of the back plate 400, and the two fixing members 350 are disposed in parallel along one side of the back plate 400. As shown in FIG. 6A, FIG. 6B and FIG. 7, two clamps 340 are attached to each fixing member 350. Accordingly, four clamps 340 are provided for each one side of the back plate 400. A lever 342 is mounted between the two fixing members 350 provided for each side of the back plate 400, and the lever 342 simultaneously operates the four clamps 340. The number of clamps provided for each one side of the back plate 400 is not limited to four, and three or less clamps or five or more clamps may be provided for each one side of the back plate 400.

A rotary shaft 341 is mounted over two fixing members 350 provided for each side of the back plate 400. The rotary shaft 341 is attached to the fixing members 350 in a rotatable manner (FIG. 7). The respective clamps 340 and the lever 342 are attached to the rotary shaft 341 in a non-rotatable manner by key connection (a key and a key groove) (FIG. 8A, FIG. 8B, FIG. 9A and FIG. 9B). Four clamps 340 are attached to the rotary shaft 341 at the same phase. On the other hand, the lever 342 is attached to the rotary shaft 341 at a phase different from the phase of the four clamps 340. With such a configuration, when the lever 342 rotates, the four clamps 340 rotate synchronously with the rotation of the lever 342. In this embodiment, the configuration is adopted where the clamps 340 rotate about the rotary shaft 341 extending parallel to the surfaces 301, 302 of the front plate body 310. However, the clamps 340 may be configured to reciprocate in the direction perpendicular to the surfaces 301, 302 of the front plate body 310 so as to clamp the back plate 400.

Figure 9A:
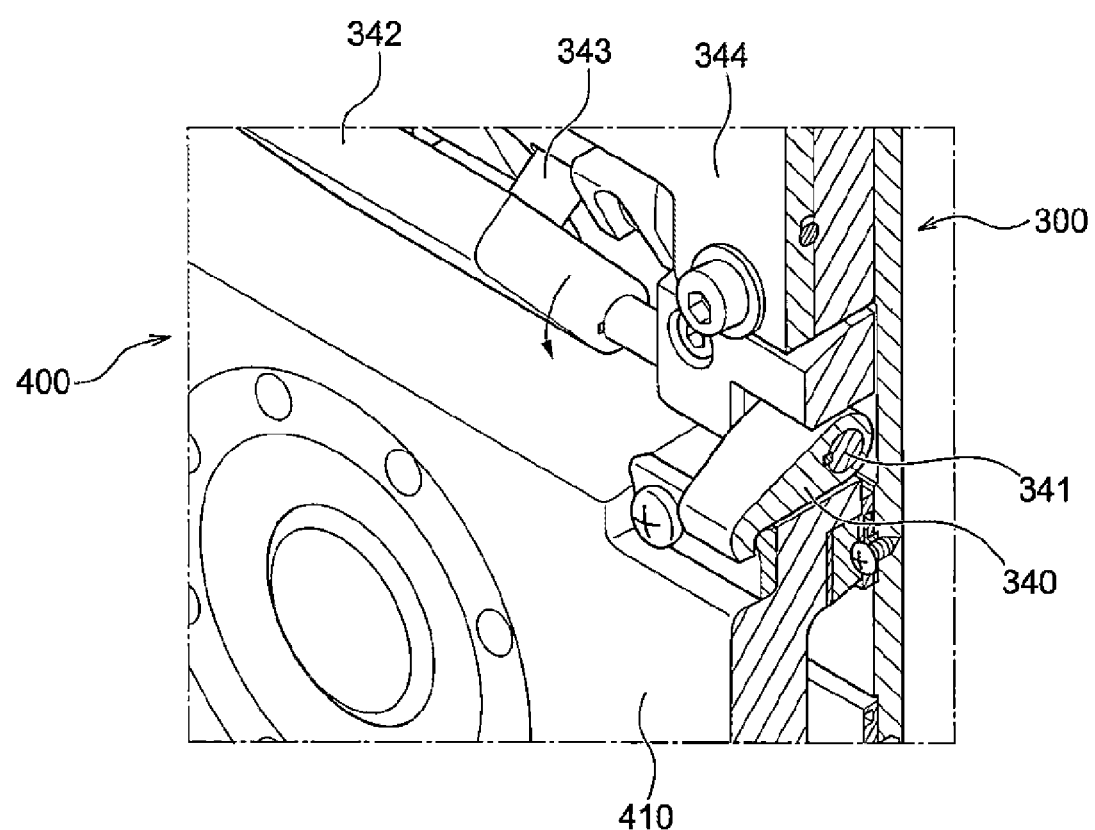
FIG. 9A is a cross-sectional perspective view of the clamp in a clamping state.
Figure 10A:
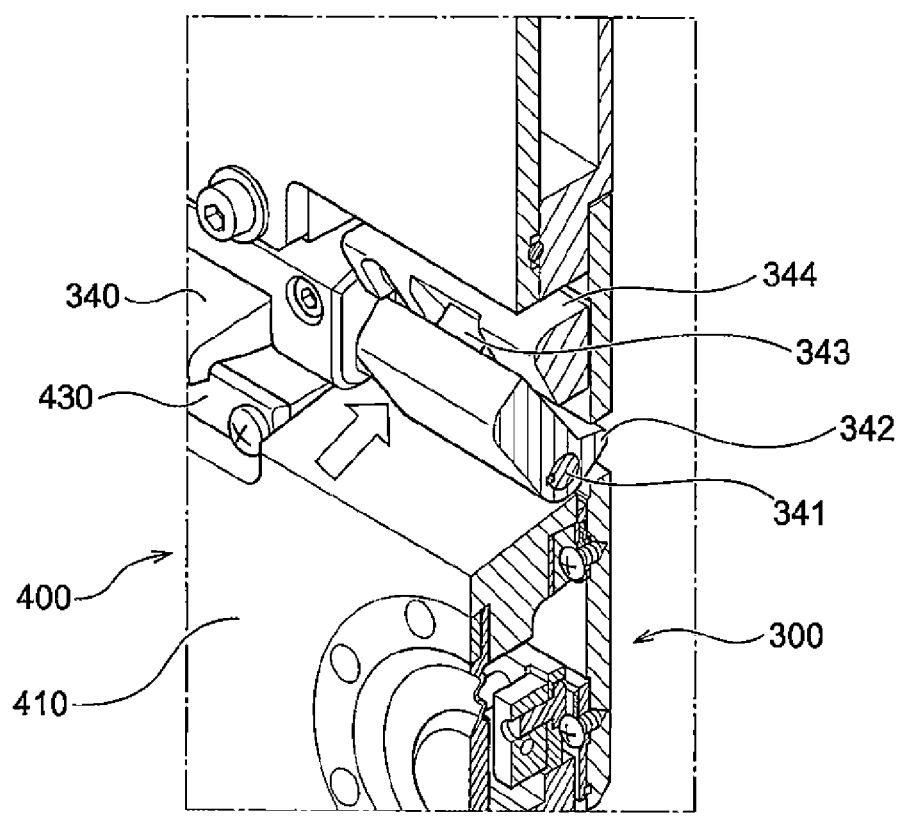
FIG. 10A is a perspective view showing a configuration of the clamp in an unclamping state.
Figure 10B:
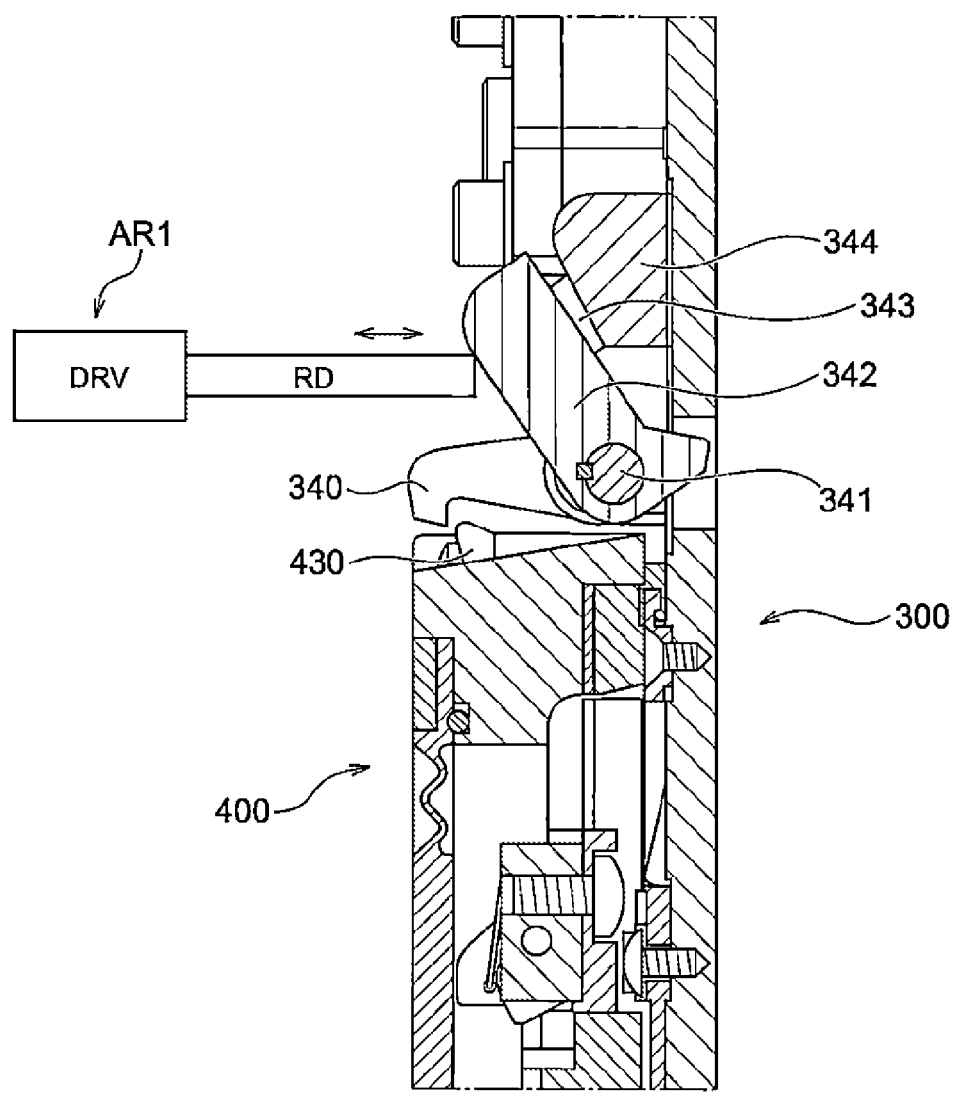
FIG. 10B is a side view of the clamp in an unclamping state.

Each clamp 340 includes an engaging portion 340a, which is bent in a hook shape, at a distal end portion thereof. Each clamp 340 has a through hole on a proximal end side thereof. The rotary shaft 341 is inserted into the through hole of the clamp 340, and the clamp 340 is fixed in a non-rotatable manner by the key and the key groove (see FIG. 9A). When an external force is not applied to the lever 342, as shown in FIG. 7, the lever 342 is biased so as to raise from the back surface 302 of the front plate 300 by a compression spring 343. Due to a biasing force of the compression spring 343, each clamp 340 is biased in the closing direction. In other words, the clamp 340 is formed of a normally-closed type clamp. The lever 342 is formed as a force receiving portion which can receive an external pressing force. For example, the lever 342 can receive a pressing force from an actuator provided in the substrate loading and unloading mechanism 29. An actuator AR1 is schematically shown in FIG. 10B. The actuator AR1 includes a driving portion DRV such as an air cylinder or a motor, and a rod-like member RD driven by the driving portion DRV, for example. Upon reception of a pressing force from the actuator AR1, the lever 342 rotates in the direction of falling toward the back surface 302 of the front plate 300. Along with the rotation of the lever 342, the clamps 340 rotate in the direction of opening. In this embodiment, four actuators AR1 are provided corresponding to the levers 342 provided for the respective sides of the back plate 400. The four actuators AR1 are preferably driven simultaneously so as to press the levers 342 simultaneously. The four actuators AR1 are not limited to be driven simultaneously, and may be driven individually.

Engagement receiving portions 430 are formed on the back surface 402 of the back plate 400 at positions corresponding to the clamps 340. As described in this embodiment, the engagement receiving portions 430 may be formed as separate bodies from the back plate body 410 of the back plate 400, and may be attached to the back plate body 410. Alternatively, the engagement receiving portions 430 may be integrally formed with the back plate body 410. A projecting portion 430a is formed on each engagement receiving portion 430. The projecting portion 430a has a shape which allows the hook-shaped engaging portion 340a of the clamp 340 to be caught by and to be engaged with the projecting portion 430a. To enable reliable engagement of the engaging portion 340a of the clamp 340 with the projecting portion 430a, the projecting portion 430a has a larger size than the engaging portion 340a.

Hereinafter, a structure for mounting the back plate 400 on the front plate 300 is described with reference to drawings.

Figure 8A:
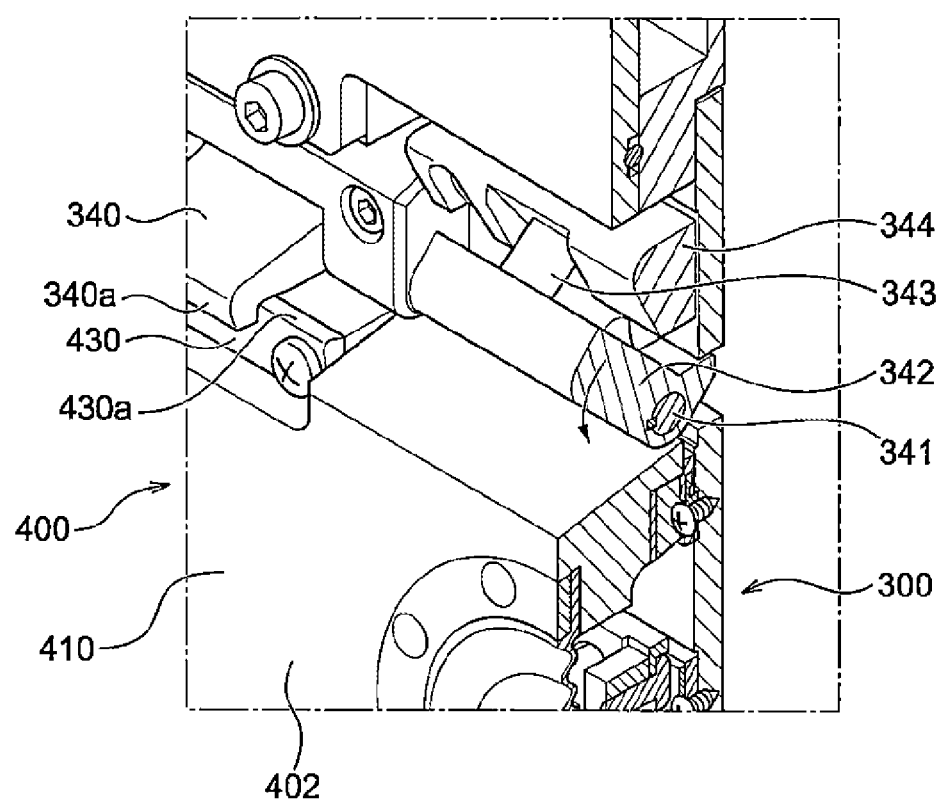
FIG. 8A is a perspective view of the clamp in a clamping state.
Figure 8B:
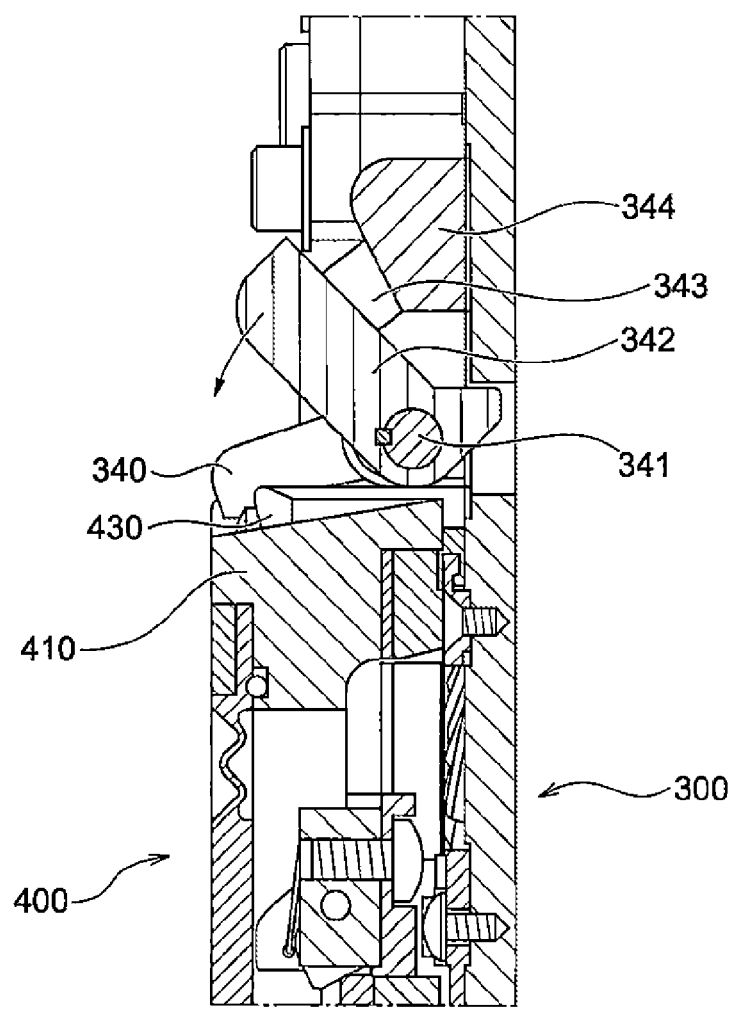
FIG. 8B is a side view of the clamp in a clamping state.
Figure 9B:
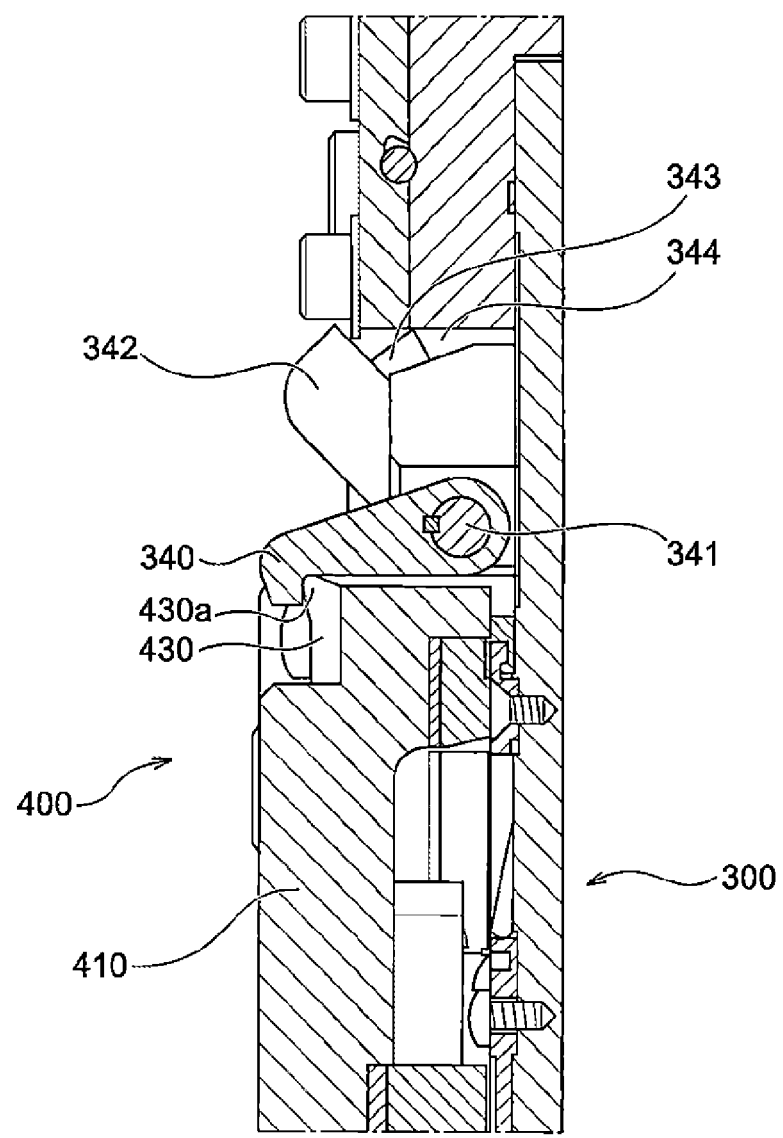
FIG. 9B is a cross-sectional view of the clamp in a clamping state.
Figure 11A:
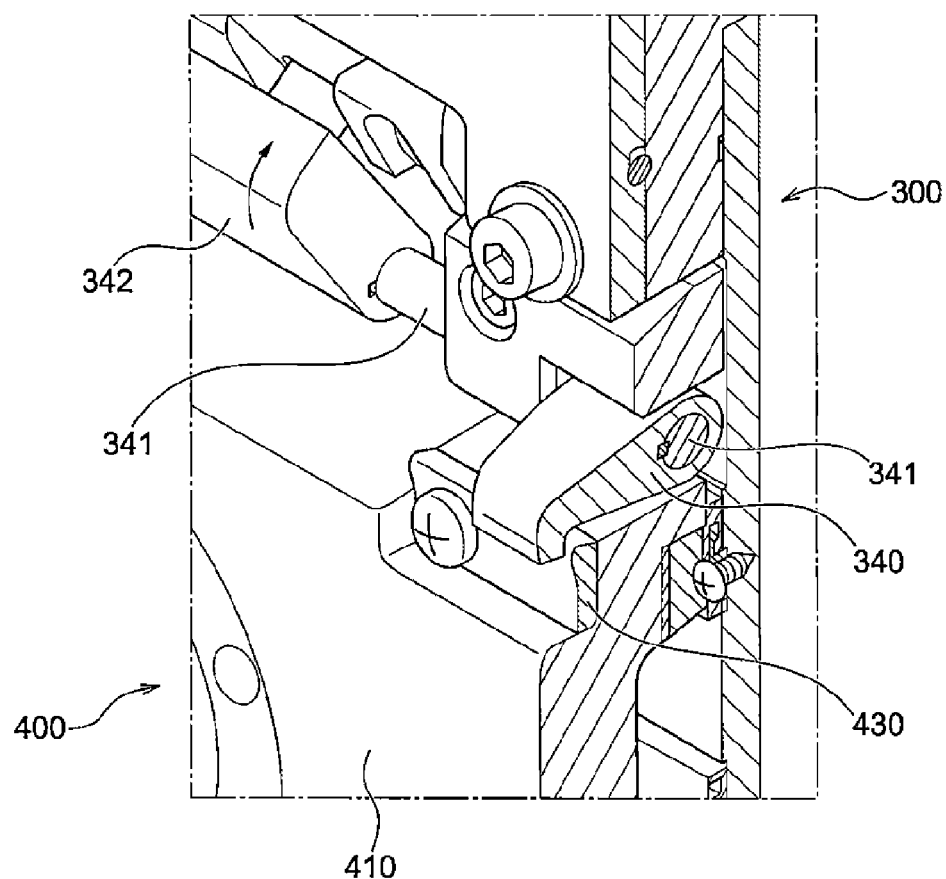
FIG. 11A is a cross-sectional perspective view of the clamp in an unclamping state.
Figure 11B:
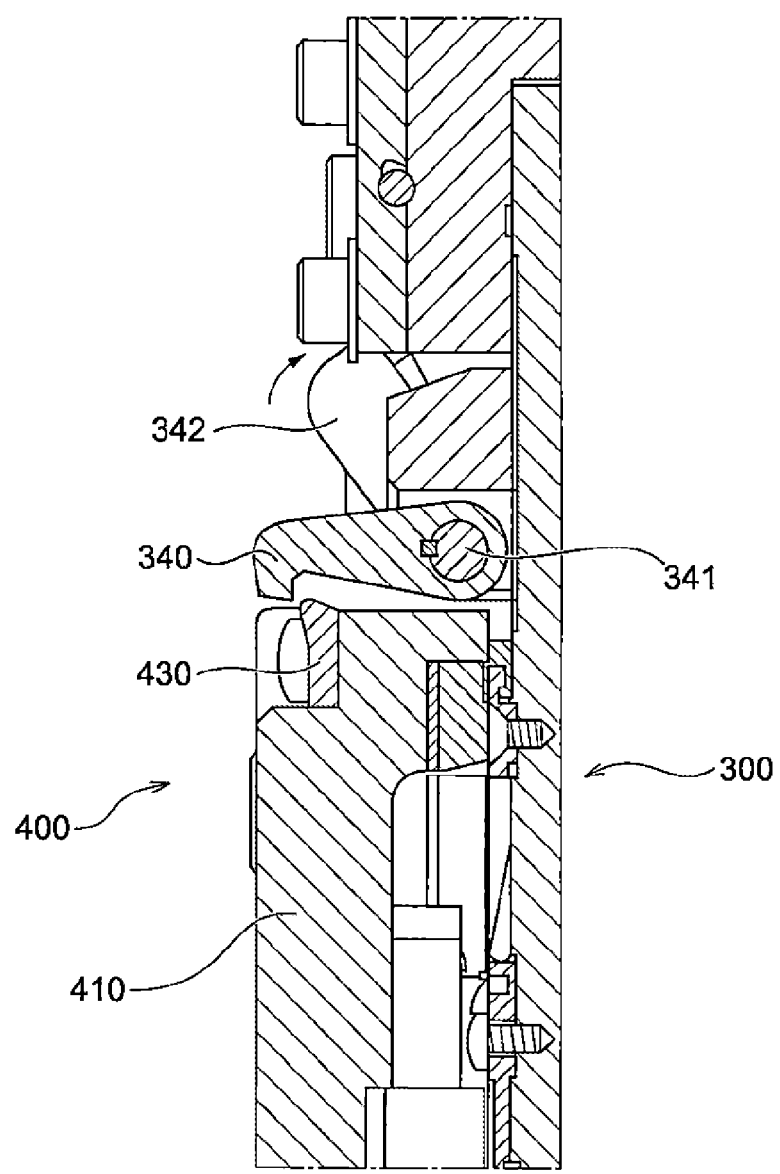
FIG. 11B is a cross-sectional view showing a configuration of the clamp in an unclamping state.

FIG. 8A is a perspective view of the clamp in a clamping state. FIG. 8B is a side view of the clamp in a clamping state. FIG. 9A is a cross-sectional perspective view of the clamp in a clamping state. FIG. 9B is a cross-sectional view of the clamp in a clamping state. FIG. 10A is a perspective view showing a configuration of the clamp in an unclamping state. FIG. 10B is a side view of the clamp in an unclamping state. FIG. 11A is a cross-sectional perspective view of the clamp in an unclamping state. FIG. 11B is a cross-sectional view showing a configuration of the clamp in an unclamping state.

As described above, the clamp 340 is of a normally-closed type. Accordingly, when a pressing force is not applied to the lever 342, as shown in FIG. 8A, FIG. 8B, FIG. 9A, and FIG. 9B, the clamp 340 is in a closed state. To mount the back plate 400 on the front plate 300, firstly, a pressing force is applied to each lever 342 of the front plate 300 by the actuator AR1 (FIG. 10B) so as to rotate each clamp 340 in the opening direction against a biasing force of the compression spring 343 as shown in FIG. 10A, FIG. 10B, FIG. 11A and FIG. 11B. In a state where the clamps 340 are open, the back plate 400 is disposed at a predetermined position on the back surface 302 of the front plate 300. In disposing the back plate 400 on the back surface 302, the position alignment pins 390 of the front plate 300 are engaged with the through holes 490a of the position alignment pieces 490 of the back plate 400 so that the back plate 400 is positioned at the predetermined position of the front plate 300.

Next, the pressing force of the actuator AR1 is removed from the lever 342 of the front plate 300. With such an operation, the lever 342 rotates toward the original position with a biasing force of the compression spring 343 so that the respective clamps 340 rotate in the closing direction. As a result, the engaging portions 340a of the clamps 340 are engaged with the engagement receiving portions 430 of the back plate 400 so that the back plate 400 is fixed to the front plate 300 (FIG. 8A, FIG. 8B, FIG. 9A and FIG. 9B).

To remove the back plate 400 from the front plate 300, as described above, a pressing force is applied to each lever 342 of the front plate 300 by the actuator (not shown in the drawing) so as to rotate each clamp 340 in the opening direction against a biasing force of the compression spring 343 (FIG. 10A, FIG. 10B, FIG. 11A and FIG. 11B). As a result, the clamps 340 are released from the engagement receiving portions 430 so that the back plate 400 can be removed from the front plate 300.

(Structure for Mounting Substrate on Back Plate)

Figure 12A:
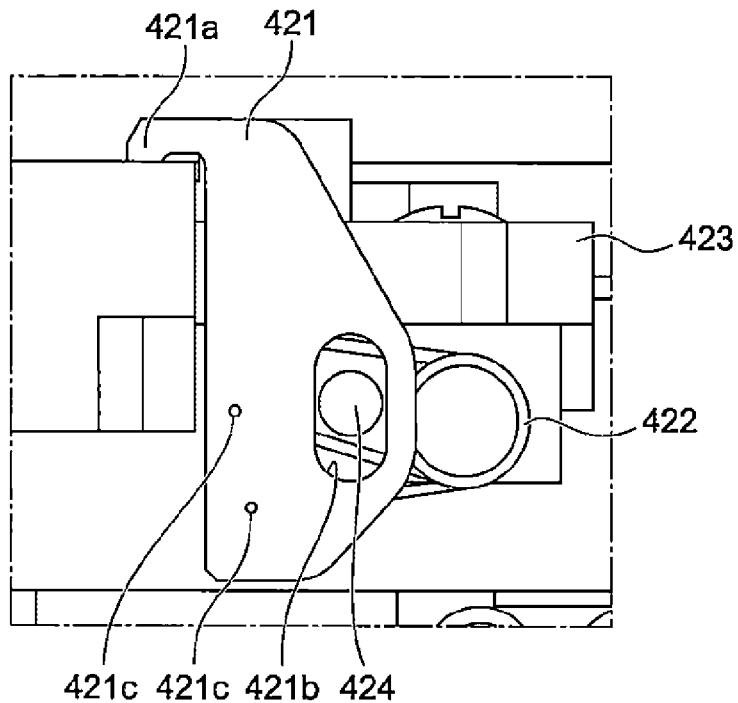
FIG. 12A is a side view with a part cut-away showing a clip of the back plate.
Figure 12B:
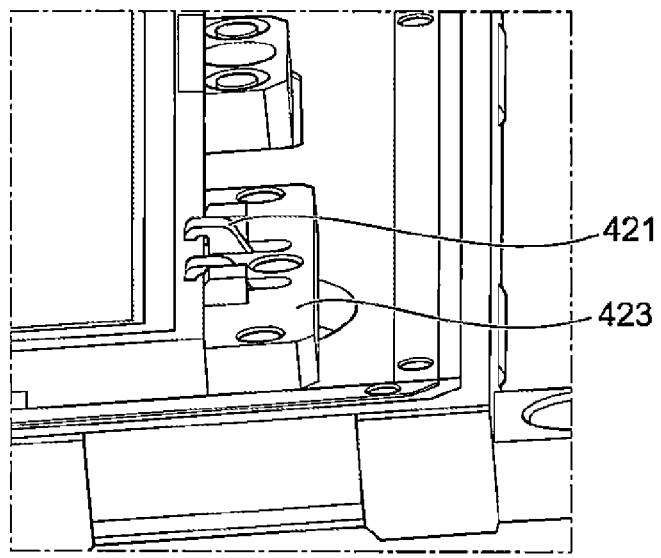
FIG. 12B is a partially enlarged perspective view showing the clips of the back plate.
Figure 13A:
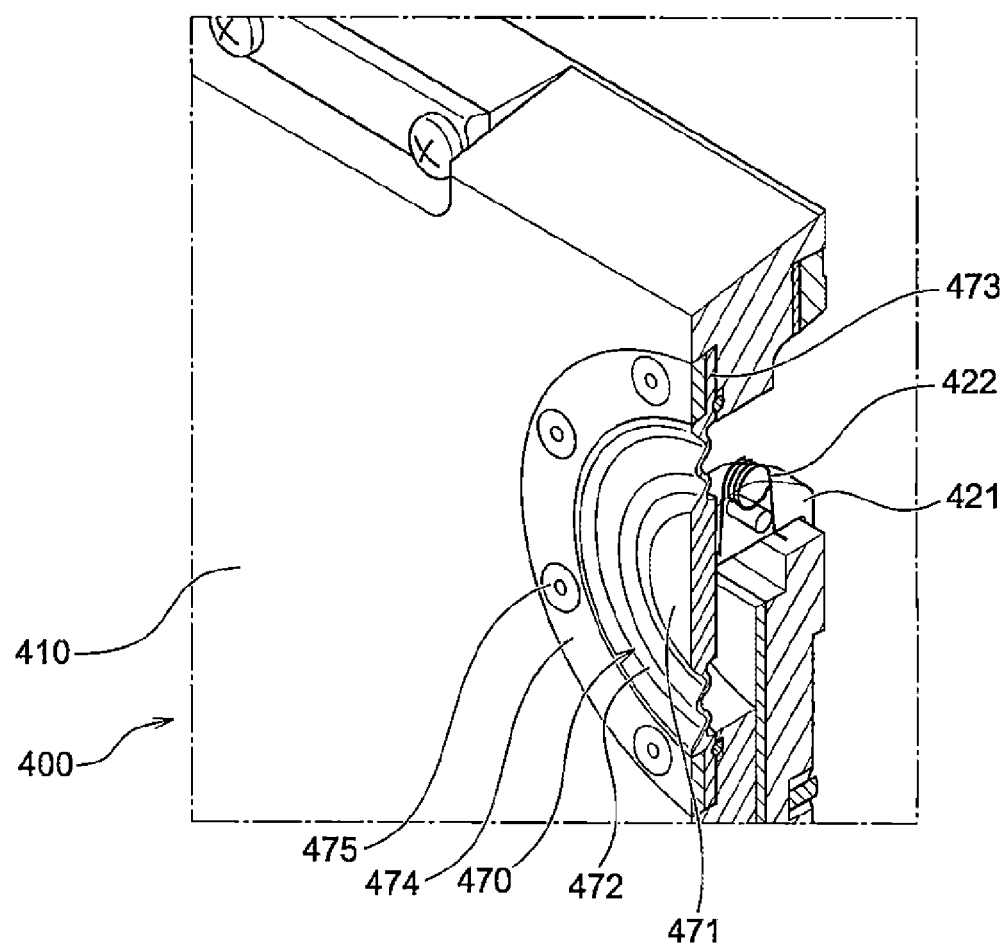
FIG. 13A is a perspective view with a part cut-away showing the clip in a closed state.
Figure 13B:
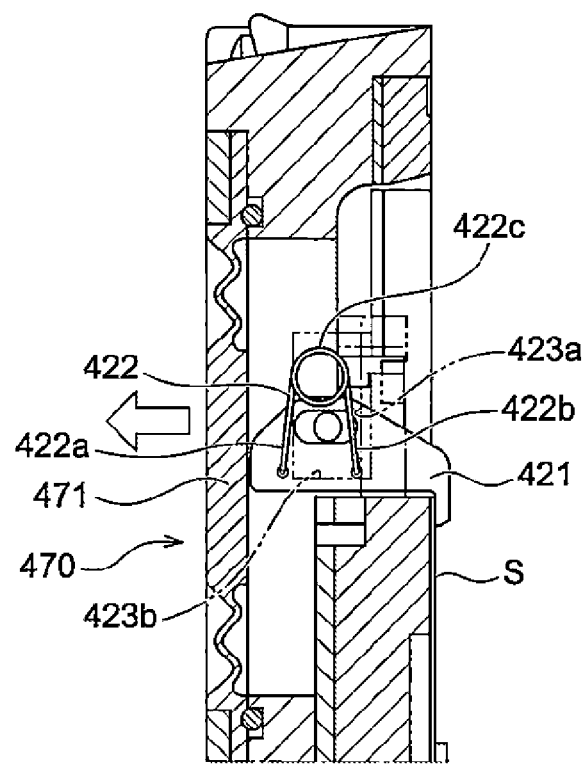
FIG. 13B is a cross-sectional view with a part cut-away showing the clip in a closed state.
Figure 14A:
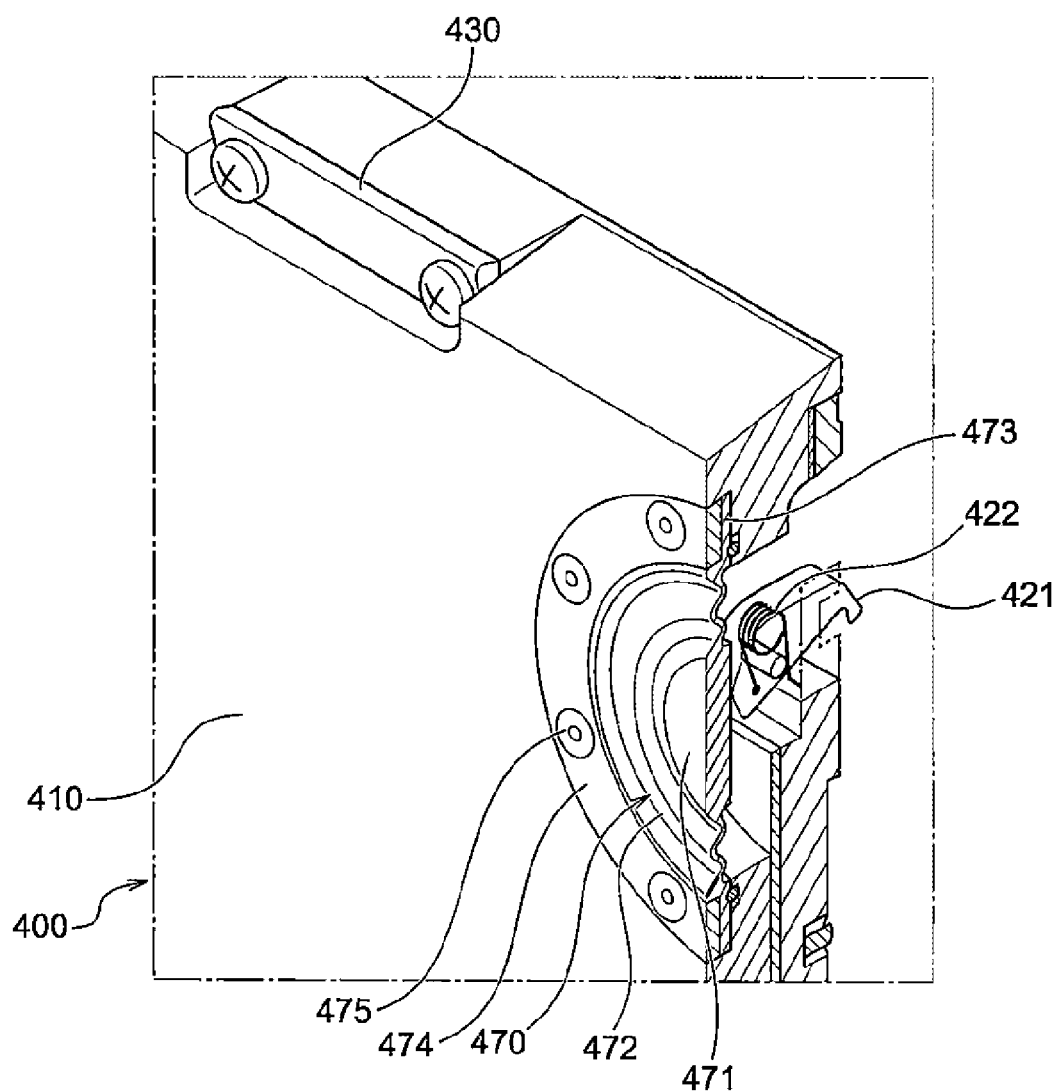
FIG. 14A is a perspective view with a part cut-away showing the clip in an open state.
Figure 14B:
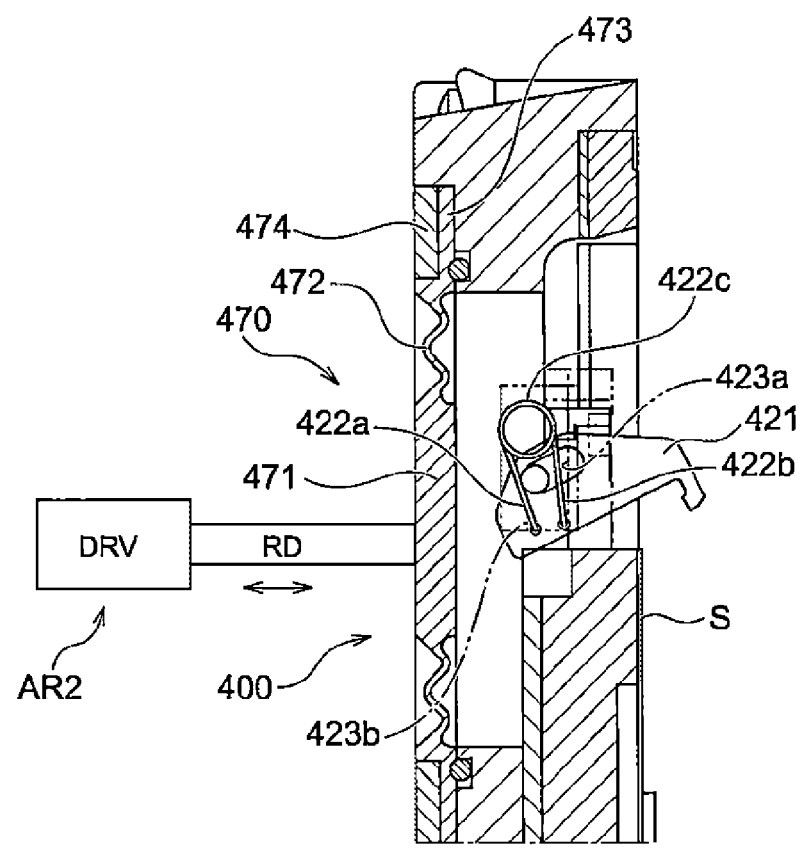
FIG. 14B is a cross-sectional view with a part cut-away showing the clip in an open state.

FIG. 12A is a side view with a part cut-away showing a clip of the back plate. FIG. 12B is a partially enlarged perspective view showing the clips of the back plate. FIG. 13A is a perspective view with a part cut-away showing the clip in a closed state. FIG. 13B is a cross-sectional view with a part cut-away showing the clip in a closed state. FIG. 14A is a perspective view with a part cut-away showing the clip in an open state. FIG. 14B is a cross-sectional view with a part cut-away showing the clip in an open state.

Eight clip portions 420 in total are provided on the front surface 401 of the back plate 400 corresponding to the respective sides of the substrate S (see FIG. 5A). Buttons 470 are formed on the back surface 402 of the back plate 400 at positions corresponding to the respective clip portions 420 (see FIG. 5B). In a state where a force is not applied to the button 470, a surface of the button 470 on a side of the front surface 401 is disposed with a predetermined distance between the surface of the button 470 and proximal end portions of two clips 421 (FIG. 13B). The button 470 includes: a force receiving portion 471; an elastic portion 472 which supports the force receiving portion 471 in a displaceable manner with respect to the back plate body 410; and a mounting portion 473 formed on an outer periphery of the elastic portion 472. The button 470 is fixed to the back surface 402 at the mounting portion 473 thereof using a pressing member 474 and fastening members 475. The fastening members 475 are studs, bolts or the like, for example.

As shown in FIG. 12A and FIG. 12B, each clip portion 420 includes: a fixed portion 423 fixed to the front surface 401 of the back plate body 410; a fixed shaft 424 fixed to the fixed portion 423 in a non-rotatable manner; two clips 421 supported on the fixed shaft 424 such that the clips 421 are rotatable while moving translationally; and coil springs 422 provided on the respective clips 421 so as to bias the clips 421 in the closing direction.

Each clip 421 includes a pawl portion 421a at a distal end portion thereof, and an elongated hole 421b and two circular holes 421c are formed in a portion of the clip 421 on the proximal end side. The clips 421 are secured in such a manner that the fixed shaft 424 is inserted into each elongated hole 421b. As shown in FIG. 13B, the coil spring 422 includes a wound portion 422c and leg portions 422a, 422b extending from the wound portion 422c. The coil spring 422 is formed such that a wire or the like is wound into a circular shape plural times thus forming the wound portion 422c, and the leg portions 422a, 422b having a predetermined length are maintained. The leg portion 422a has a bent portion, which is bent at a substantially right angle, at a distal end thereof, and the bent portion is inserted and fitted into the circular hole 421c which is disposed on the proximal end side out of two circular holes 421c formed in each clip 421. The other leg portion 422b is not attached to the clip 421. The other leg portion 422b has a bent portion, which is bent at a substantially right angle, at a distal end thereof, and the bent portion is supported in a state of being brought into contact with a restricting surface 423a formed on the fixed portion 423. The leg portion 422a is guided by a guide surface 423b formed on the fixed portion 423 (FIG. 13B and FIG. 14B).

With such a configuration, each clip 421 can rotate toward the outer side of the back plate body 410 while moving in the direction along which the clip 421 is separated from the back plate body 410 (from FIG. 13B to FIG. 14B). As a result, the clip 421 is brought into an open state (FIG. 14A and FIG. 14B). The clip 421 can also rotate reversely toward the inner side of the back plate body 410 while moving in the direction along which the clip 421 approaches the back plate body 410 (from FIG. 14B to FIG. 13B). As a result, the clip 421 is brought into a closed state (FIG. 13A and FIG. 13B). In this embodiment, in a state where an external force is not applied to the clip 421, the clip 421 is biased in the closing direction by the coil spring 422. That is, the clip 421 is of a normally-closed type (FIG. 13A and FIG. 13B). In FIG. 14B, to prevent the drawing from becoming complicated, a state is shown where the force receiving portion 471 of the button 470 is not displaced. However, in an actual operation, the force receiving portion 471 presses the clips 421 in a displaced state toward the clips 421. With such pressing, the clips 421 are brought into an open state.

To place the substrate S on the back plate 400, an external pressing force is applied to eight buttons 470 (force receiving portions 471) of the back plate 400 by actuators AR2 (FIG. 14B). With such an operation, as shown in FIG. 14A and FIG. 14B, each force receiving portion 471 is displaced toward the side of the front surface 401 thus being brought into contact with the proximal end portions of two clips 421. With the force received from the force receiving portion 471, as shown in FIG. 14B, each clip 421 rotates toward the outer side of the back plate body 410 while moving in the direction along which the clip 421 is separated from the back plate body 410 so that the clip 421 is brought into an open state (FIG. 14B). As schematically shown in FIG. 14B, the actuator AR2 includes a driving portion DRV such as an air cylinder or a motor, and a rod-like member RD driven by the driving portion DRV, for example. Eight actuators AR2 are provided corresponding to eight buttons 470. The eight actuators AR2 are preferably driven simultaneously so as to press the buttons 470 simultaneously. The eight actuators AR2 are not limited to be driven simultaneously, and may be driven individually.

In a state where the clips 421 are in an open state, the substrate S is placed at a predetermined position on the front surface 401 of the back plate 400. Thereafter, a pressing force applied to the buttons 470 by the actuators AR2 is released. As a result, each clip 421 is rotated toward the inner side of the back plate body 410 while being moved in the direction along which the clip 421 approaches the back plate body 410 with a biasing force of the coil spring 422 so that the clip 421 is brought into a closed state (from FIG. 14B to FIG. 13B). At this stage of operation, the pawl portion 421a formed on the distal end of each clip 421 is engaged with a peripheral edge portion of the substrate S thus fixing the substrate S to the front surface 401 of the back plate 400.

The back plate 400 on which the substrate S is mounted as described above is attached to the front plate 300 as described with reference to FIG. 5 to FIG. 13. With such an operation, mounting of the substrate S on the substrate holder 1 is completed. To remove the substrate S from the back plate 400, as described previously, an external pressing force is applied to the eight buttons 470 (force receiving portions 471) of the back plate 400 by the actuators AR2 (FIG. 14A and FIG. 14B).

In this embodiment, the configuration is adopted where the clips 421 rotate about the fixed shaft 424 extending parallel to the surfaces 401, 402 of the back plate body 410. However, the clips 421 may be configured to reciprocate in the direction perpendicular to the surfaces 401, 402 of the back plate body 410 so as to clamp the substrate S.

(Configuration of Seal Portion)

Figure 15:
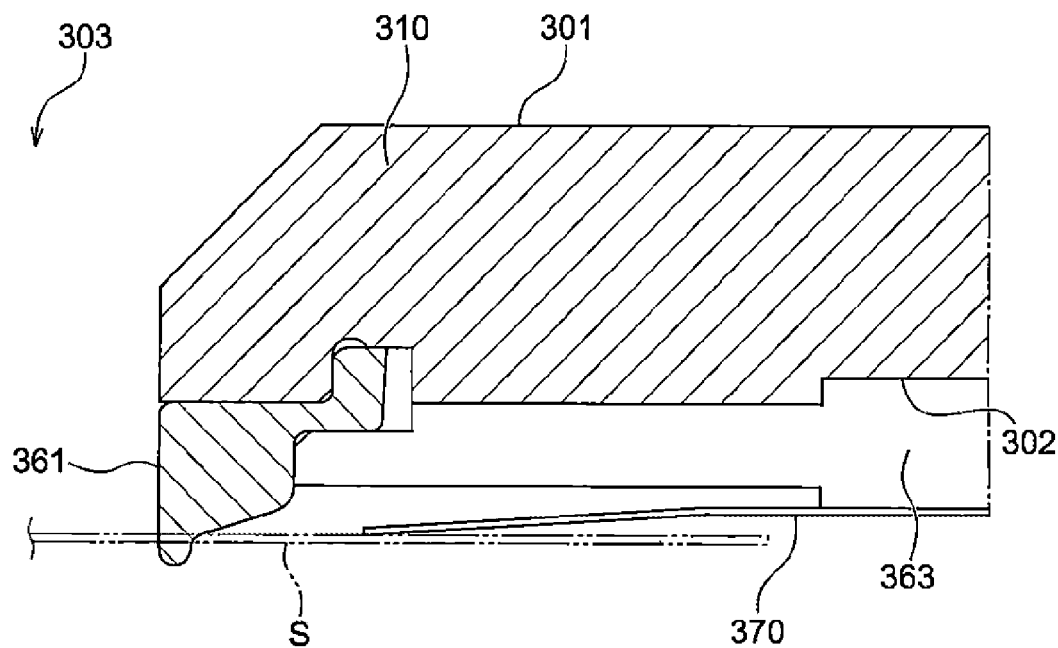
FIG. 15 is a cross-sectional view showing an inner seal portion of the front plate.
Figure 16:
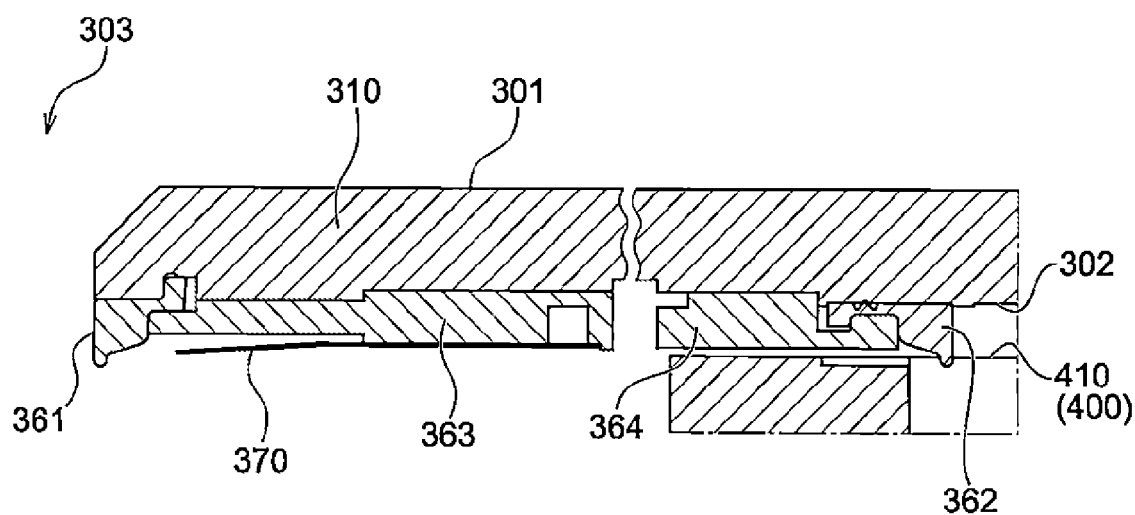
FIG. 16 is a cross-sectional view showing the inner seal portion and an outer seal portion of the front plate.

FIG. 15 is a cross-sectional view showing an inner seal portion of the front plate. FIG. 16 is a cross-sectional view showing the inner seal portion and an outer seal portion of the front plate.

An inner seal 361 is provided at the back surface 302 of the front plate 300 such that the inner seal 361 is disposed adjacently to the opening portion 303. The inner seal 361 is attached to the back surface 302 of the front plate 300 by a seal holder 363. The inner seal 361 provides sealing between the substrate S and the front plate 300 thus preventing a plating solution from intruding into an end portion of the substrate S. Also, contacts 370 for supplying a potential to the substrate S is mounted on the seal holder 363.

As shown in FIG. 16, an outer seal 362 is attached to the back surface 302 of the front plate 300 by a seal holder 364 at a position outside the inner seal 361. The outer seal 362 is brought into contact with the back plate 400 thus providing sealing between the front plate 300 and the back plate 400.

In this embodiment, the seal holder 363 for mounting the inner seal 361 and the seal holder 364 for mounting the outer seal 362 are formed of separate members and hence, the inner seal 361 and the outer seal 362 can be individually replaced.

Figure 17:
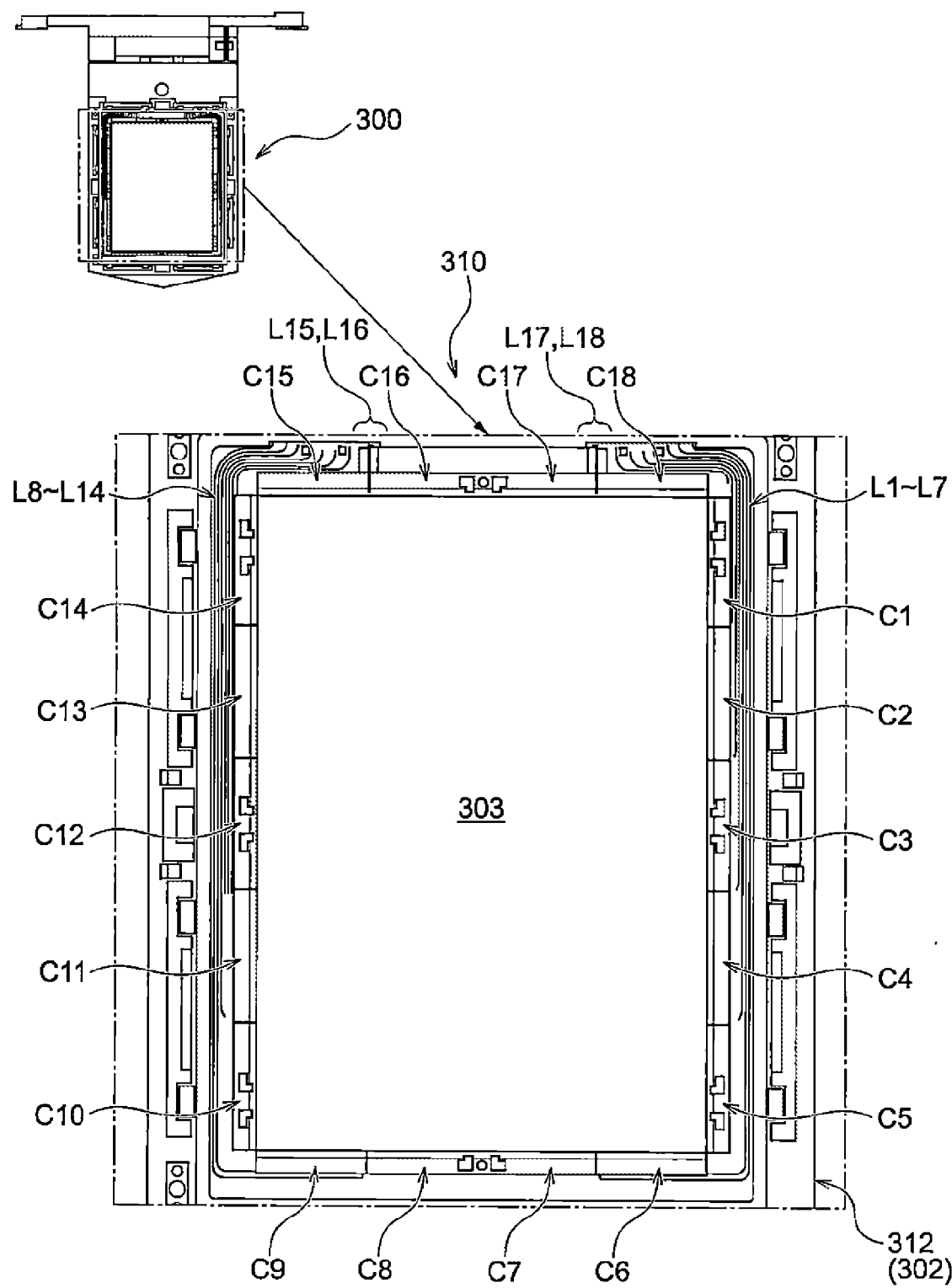
FIG. 17 is a back view of a front plate body.
Figure 18:
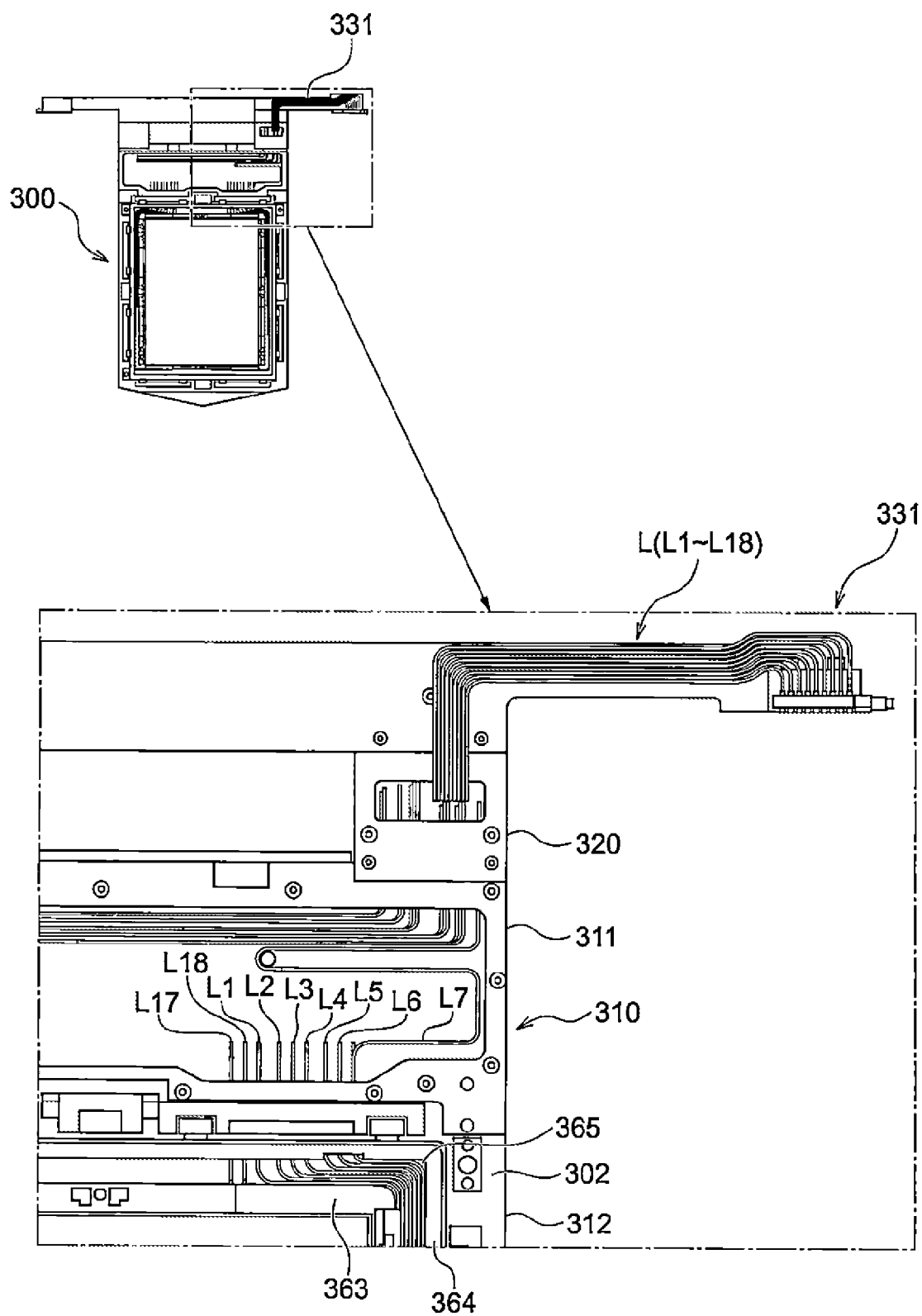
FIG. 18 is a partially enlarged plan view of a region of the front plate which includes a connector.
Figure 19A:
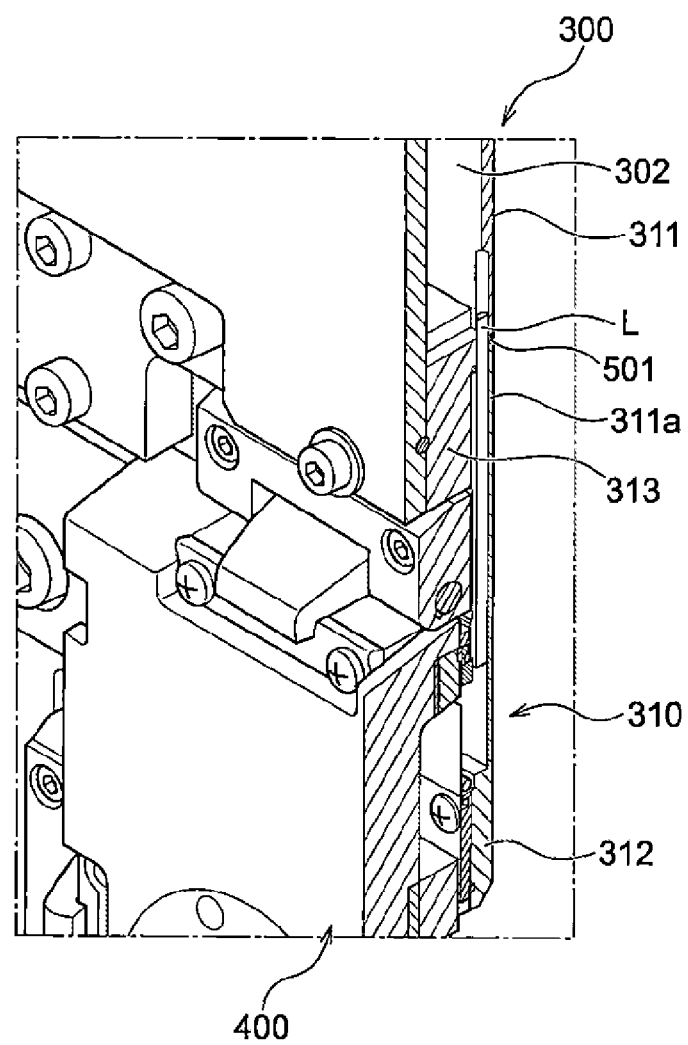
FIG. 19A is a cross-sectional perspective view of the front panel.
Figure 19B:
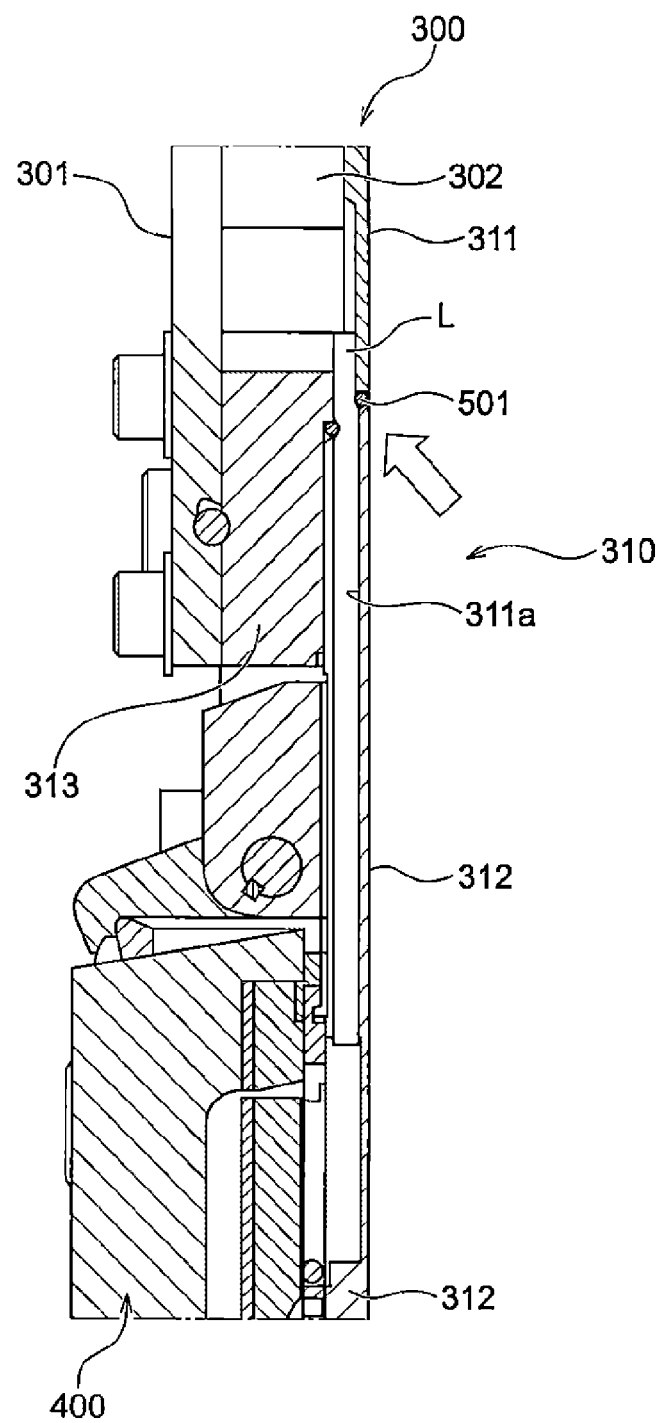
FIG. 19B is a cross-sectional view of the front panel.
Figure 19C:
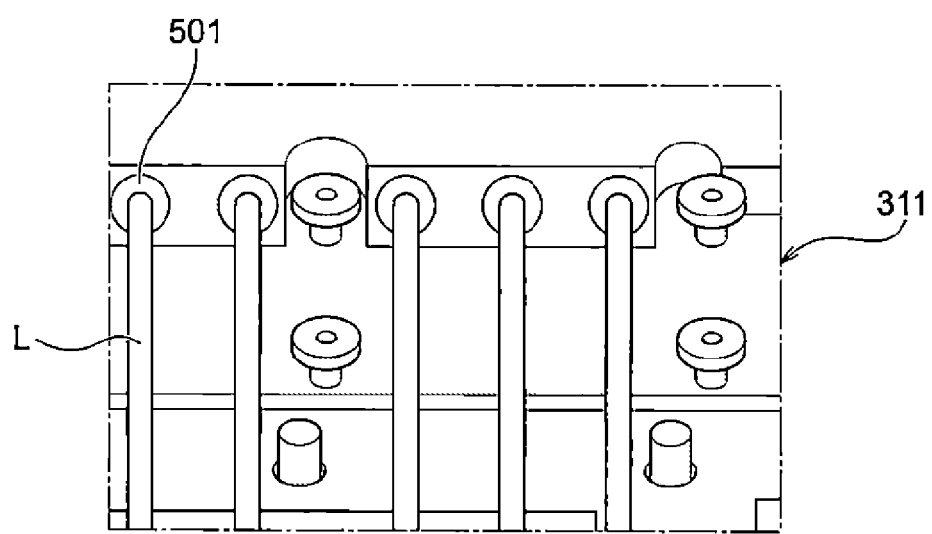
FIG. 19C is a partially enlarged perspective view of the front panel showing the arrangement of cables.
Figure 20A:
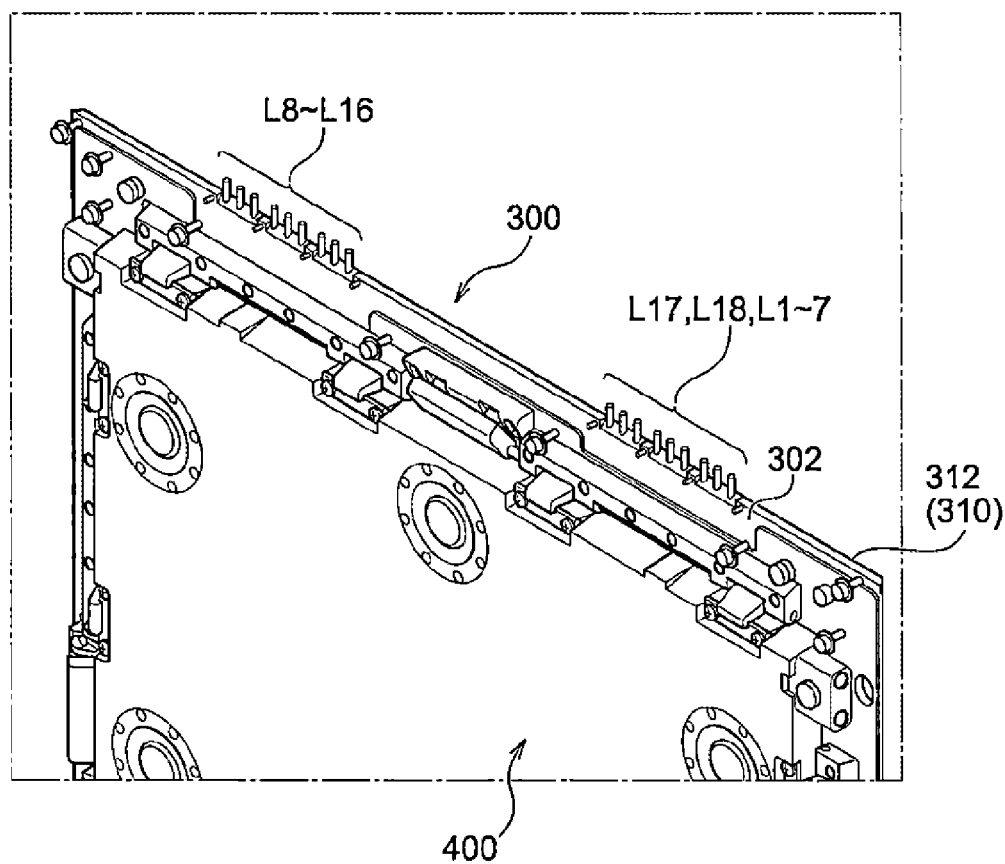
FIG. 20A is a perspective view of a portion of a face portion in the vicinity of the position where the cables are introduced with the illustration of a wiring buffer portion omitted.
Figure 20B:
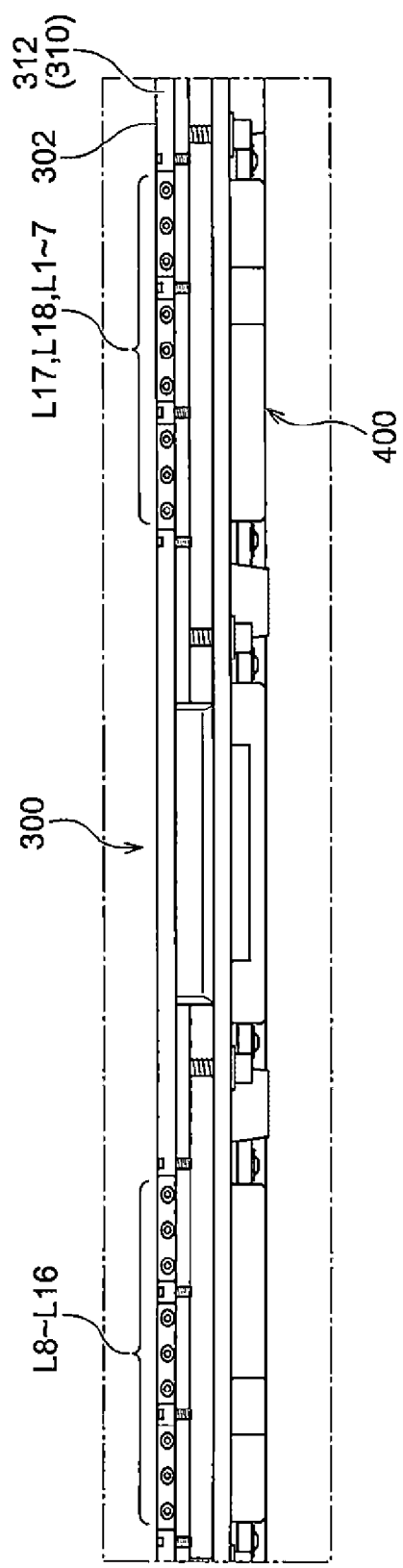
FIG. 20B is a top plan view showing the portion of the face portion in the vicinity of the position where the cables are introduced with the illustration of the wiring buffer portion omitted.
Figure 20C:
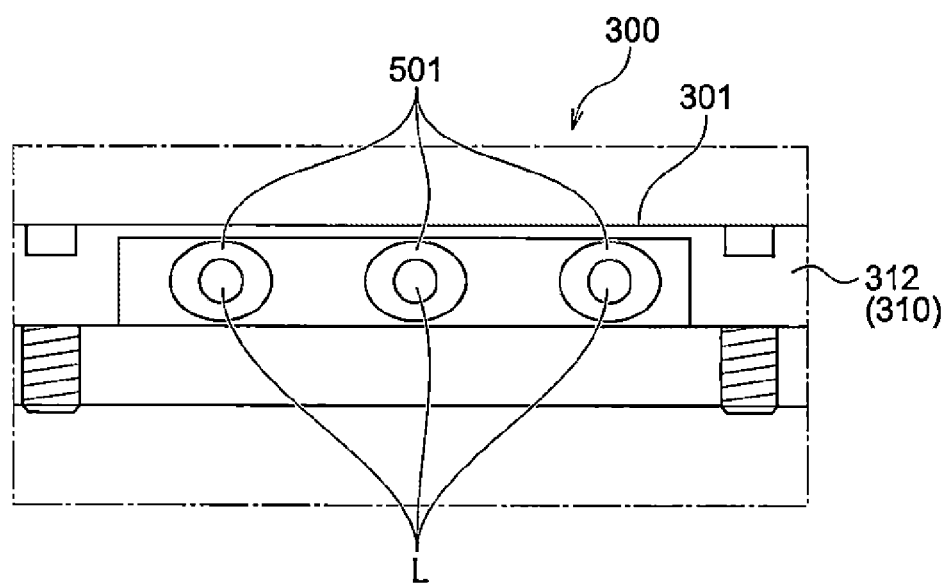
FIG. 20C is an enlarged view of the top plan view showing the portion of the face portion in the vicinity of the position where the cables are introduced with the illustration of the wiring buffer portion omitted.

FIG. 17 is a back view of the front plate body. FIG. 18 is a partially enlarged plan view of a region of the front plate which includes the connector. FIG. 19A is a cross-sectional perspective view of the front panel. FIG. 19B is a cross-sectional view of the front panel. FIG. 19C is a partially enlarged perspective view of the front panel showing the arrangement of cables. FIG. 20A is a perspective view of a portion of a face portion in the vicinity of the position where the cables are introduced with the illustration of the wiring buffer portion omitted. FIG. 20B is a top plan view showing the portion of the face portion in the vicinity of the position where the cables are introduced with the illustration of the wiring buffer portion omitted. FIG. 20C is an enlarged view of the top plan view showing the portion of the face portion in the vicinity of the position where the cables are introduced with the illustration of the wiring buffer portion omitted.

The back surface 302 of the front plate body 310 has eighteen contact regions C1 to C18. The contact regions C1 to C7, C17, C18 are disposed in a half region (a first region, a right half region in FIG. 17) of the face portion 312 on a side close to the connector 331. The contact regions C8 to C16 are disposed in a half region (a second region, a left half region in FIG. 17) of the face portion 312 on a side away from the connector 331. In the description made hereinafter, for the sake of convenience, cables arranged in the first region may be referred to as "cables of a first group", and cables arranged in the second region may be referred to as "cables of a second group".

Each contact region C1 to C18 includes a contact (contact member) 370 shown in FIG. 15 and FIG. 16 for supplying power to the substrate S. External power is respectively supplied to the contacts 370 in the respective contact regions C1 to C18 through cables L1 to L18. In the description made hereinafter, the cables L1 to L18 may be collectively referred to as "cables L" when it is not necessary to differentiate the respective cables from each other. An arbitrary cable may be referenced as the cable L.

First end portions of the cables L1 to L18 are connected to the connector 331 disposed at one end of the arm portion 330. To be more specific, the first end portions of the cables L1 to L18 are electrically connected to individual contacts in the connector 331 or each plurality of cables is electrically connected to a common contact (not shown in the drawing). The cables L1 to L18 can be electrically connected to an external power source (power source circuit, power source device or the like) through the respective contacts of the connector 331.

Figure 22:
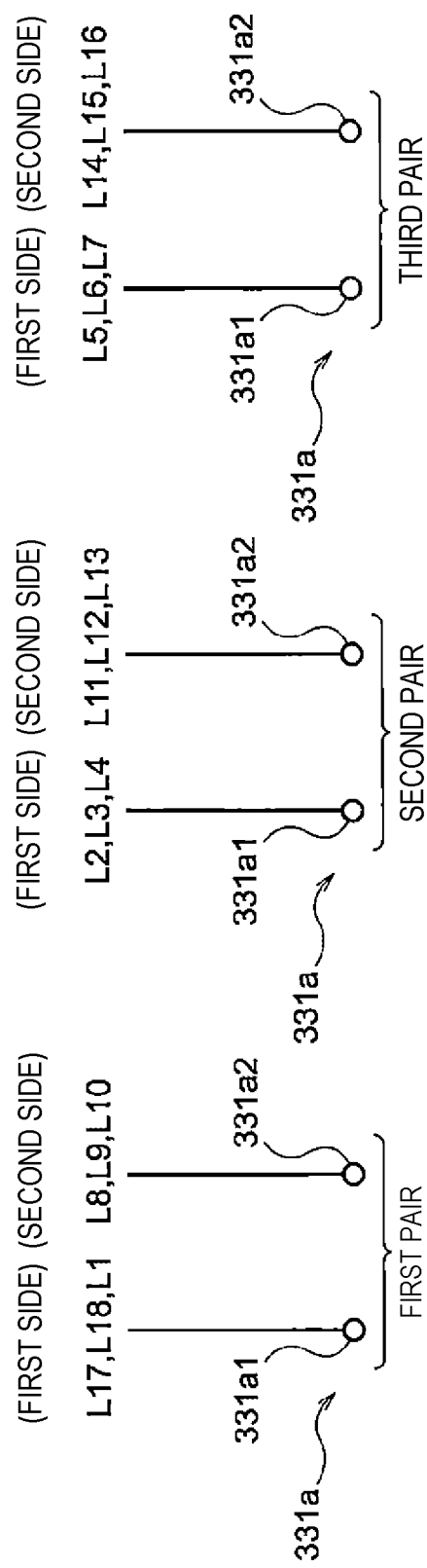
FIG. 22 is an explanatory view for describing a connection relationship between the cables and external connection contacts.

FIG. 22 is an explanatory view for describing a connection relationship between the cables and external connection contacts.

The cables L1 to L18 are connected to external connection contacts 331a1, 331a2 in the connector 331 (FIG. 22). The external connection contacts 331a1, 331a2 are connected with power supply terminals of an external power source. For example, three cables of the first group (L1 to L7, L17, L18) are connected to the common external connection contact 331a1 on the first side, and three cables of the second group (L8 to L16) are connected to the common external connection contact 331a2 on the second side. The external connection contact 331a1 on the first side and the external connection contact 331a2 on the second side are assumed as a pair of external connection contacts 331a. In this embodiment, the first side and the second side correspond to the respective sides when two contacts are disposed parallel to each other in the connector 331. For example, when the connector 331 of the substrate holder 1 is viewed from the right side in FIG. 17, the right side is assumed as the first side, and the left side is assumed as the second side.

To be more specific, the external connection contacts are configured as follows.

The cables L17, L18, L1 are connected to the common external connection contact 331a1 on the first side, and the cables L8, L9, L10 are connected to the common external connection contact 331a2 on the second side. The external connection contact 331a1 on the first side and the external connection contact 331a2 on the second side are assumed as a pair (referred to as "first pair" or "first pair 331a of external connection contacts").

The cables L2, L3, L4 are connected to another external connection contact 331a1 on the first side, and the cables L11, L12, L13 are connected to another external connection contact 331a2 on the second side. The external connection contact 331a1 on the first side and the external connection contact 331a2 on the second side are assumed as a pair (referred to as "second pair" or "second pair 331a of external connection contacts").

The cables L5, L6, L7 are connected to another external connection contact 331a1 on the first side, and the cables L14, L15, L16 are connected to another external connection contact 331a2 on the second side. The external connection contact 331a1 on the first side and the external connection contact 331*a*2 on the second side are assumed as a pair (referred to as "third pair" or "third pair 331*a* of external connection contacts").

In the connector 331, the external connection contact 331*a*1 on the first side and the external connection contact 331*a*2 on the second side of each pair 331*a* of the external connection contacts are arranged so as to opposedly face each other. The external connection contact 331*a*1 on the first side and the external connection contact 331*a*2 on the second side of the first pair 331*a* of the external connection contacts are arranged so as to opposedly face each other. The external connection contact 331*a*1 on the first side and the external connection contact 331*a*2 on the second side of the second pair 331*a* of the external connection contacts are arranged so as to opposedly face each other. The external connection contact 331*a*1 on the first side and the external connection contact 331*a*2 on the second side of the third pair 331*a* of the external connection contacts are arranged so as to opposedly face each other.

Conduction confirmation processing is performed in the substrate loading and unloading mechanism 29. To be more specific, after the substrate S is held by the substrate holder 1 (after the back plate 400 is fixed by the clamps 340 of the front plate 300), a resistance measuring instrument (not shown in the drawing) is connected to the first to third pairs of the connector 331, and a predetermined inspection voltage is applied between the external connection contact on the first side and the external connection contact on the second side of each pair. With such operations, an electrical resistance between the external connection contact on the first side and the external connection contact on the second side of each pair is measured. When an electrical resistance of each pair is equal to or less than a predetermined value and falls within a predetermined range (there is no variation in the electrical resistance between the respective pairs so that there is no abnormality such as disconnection), it is determined that the substrate holder 1 has favorable conduction (conduction confirmation processing). The conduction confirmation processing is performed by the control part 175C of the controller 175. The conduction confirmation processing may be included in "control of loading and unloading a substrate to and from the substrate holder performed by the substrate loading and unloading mechanism 29" described previously.

As described later, second end portions forming the other ends of the cables L1 to L18 are electrically connected to the contacts 370 in the contact regions C1 to C18 respectively. The respective cables L1 to L18 extend from the connector 331 along the arm portion 330, and pass through one mounting portion 320 and, then, enter the wiring buffer portion 311 (FIG. 18). In the wiring buffer portion 311, the cables L17, L18, L1 to L7 out of the cables L1 to L18 extend to the first region (the region on the side close to the connector). On the other hand, the cables L8 to L16 extend to the second region (the region on the side away from the connector). FIG. 18 mainly shows the cables L17, L18, L1 to L7 of the first group arranged in the first region. As shown in FIG. 18, the cables L17, L18, L1 to L7 of the first group pass the wiring buffer portion 311, and are introduced into a cable path 365 defined between the seal holders 363, 364 on the face portion 312. Although not shown in the drawing, the cables L8-16 of the second group also pass the second region (the region on the side away from the connector) of the wiring buffer portion 311, and are introduced into a cable path 365 in the second region on the face portion 312. In FIG. 18, to prevent the drawing from becoming complicated, the cables are illustrated with a portion having a certain length omitted. In the wiring buffer portion 311, the cables L1 to L18 may be desirably arranged so as to store portions of the cables L1 to L18 having a certain length as a margin.

A thick wall portion 313 is formed on a face portion 312 side of the wiring buffer portion 311 (FIG. 19A and FIG. 19B). Wiring holes 311*a*, which correspond to the respective cables L1 to L18, are formed on the thick wall portion 313 of the wiring buffer portion 311 and on the face portion 312 up to the cable path 365 defined between the seal holders 363, 364 (FIG. 19A and FIG. 19B). In this embodiment, each wiring hole 311*a* is a drilled hole having a diameter which allows the cable to pass therethrough. Although only one wiring hole 311*a* is shown in FIG. 19A, in an actual holder, a plurality of wiring holes 311*a* are formed corresponding to the respective cables as shown in FIG. 19C. The number of wiring holes 311*a* is set to a value at least equal to or larger than the number of cables.

In this embodiment, as shown in FIG. 19A and FIG. 19B, the wiring buffer portion 311 is formed as a separate body from the face portion 312 of the front panel body 310, and the wiring buffer portion 311 is attached to the face portion 312. On a boundary between the wiring buffer portion 311 and the face portion 312, O rings 501 are disposed on peripheries of the cables so as to provide sealing between the wiring holes 311*a* and the cables L. With such a configuration, the wiring holes 311*a* and the cables L are protected from a plating solution or external foreign materials.

Figure 21A:
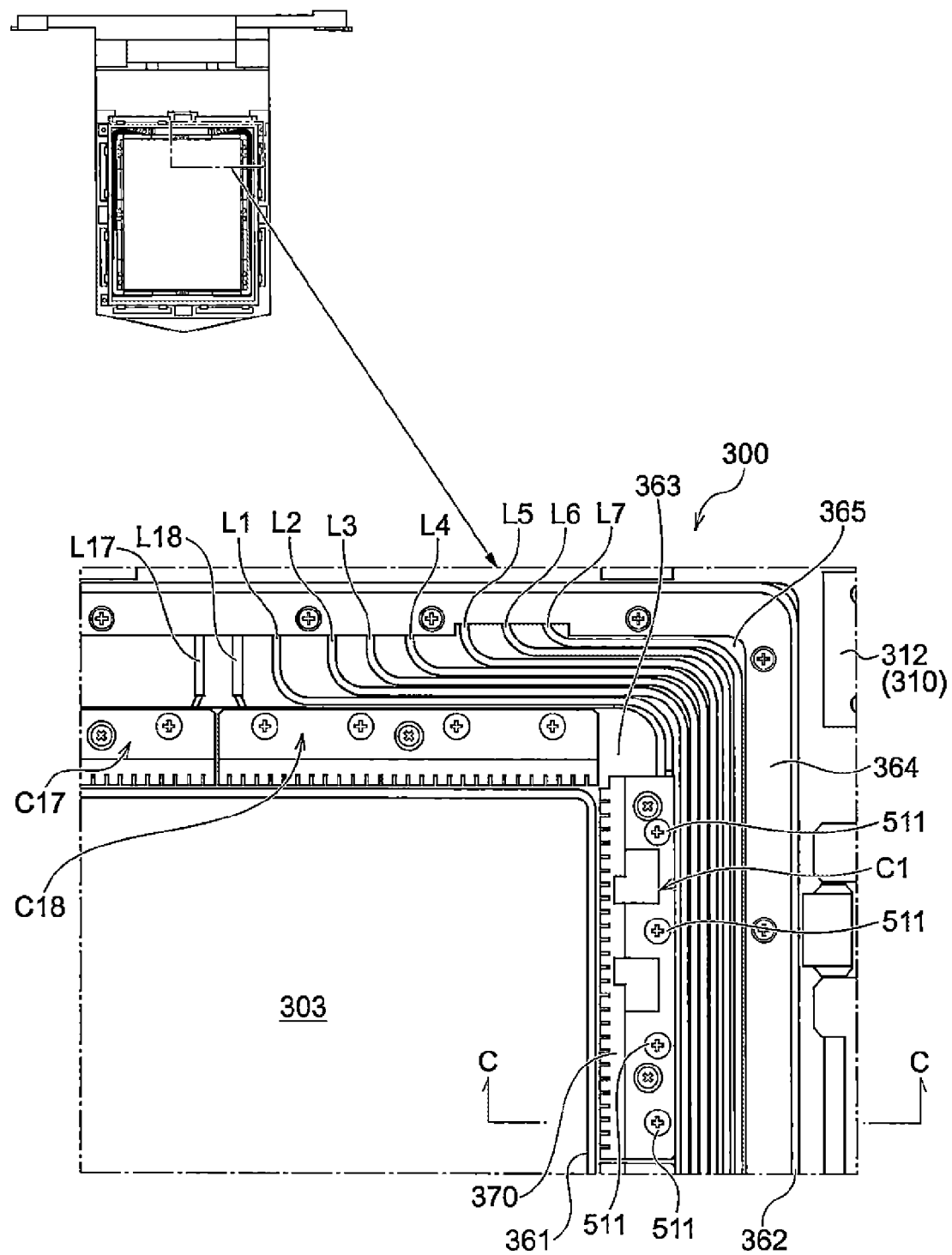
FIG. 21A is a back view of a portion of the face portion in the vicinity of a corner portion on the side close to the connector.
Figure 21B:
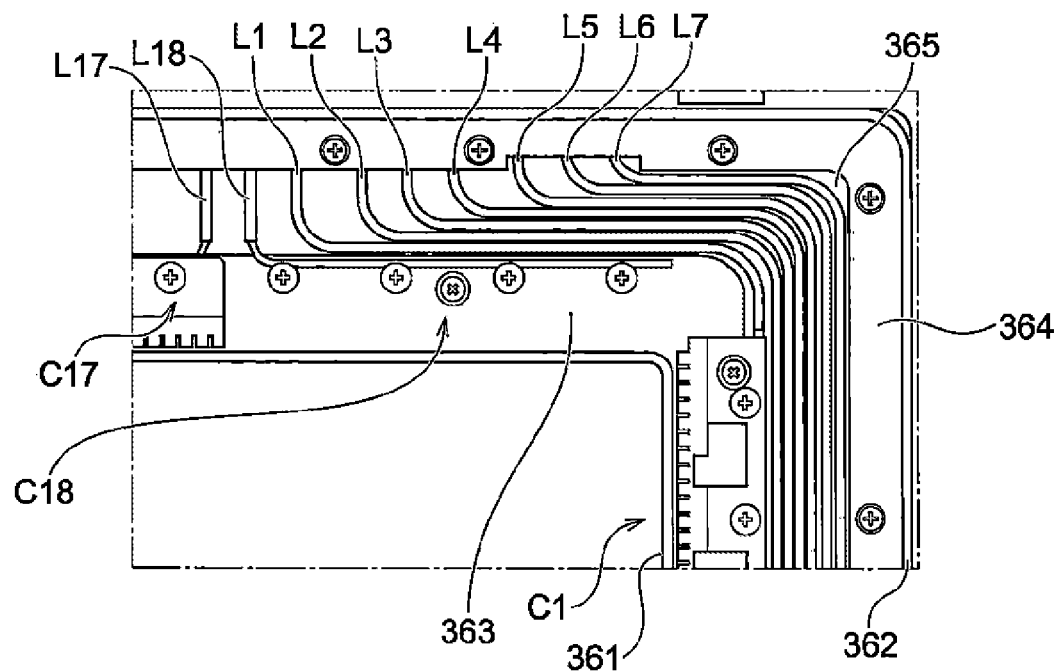
FIG. 21B is a back view showing the portion of the face portion in the vicinity of the corner portion on the side close to the connector in a further enlarged manner.
Figure 21C:
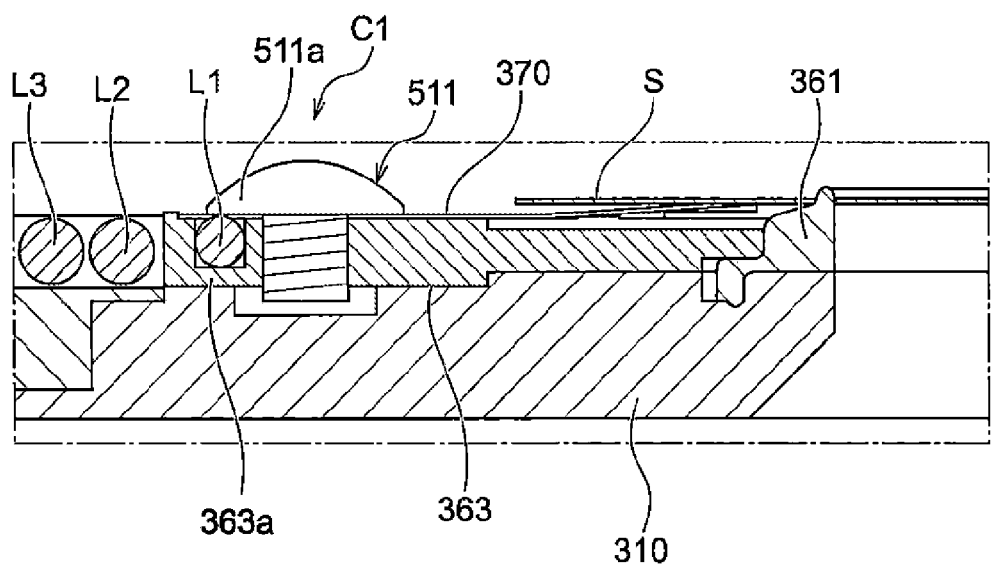
FIG. 21C is a cross-sectional view taken along line C-C in FIG. 21A.
Figure 21D:
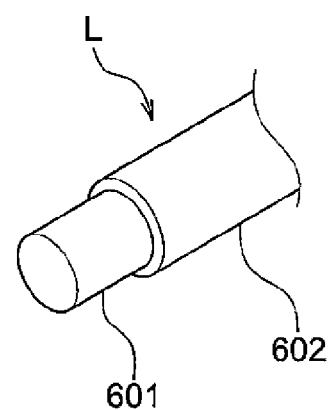
FIG. 21D is a perspective view of a portion of the cable from which a cover is removed.

FIG. 21A is a back view of a portion of the face portion in the vicinity of a corner portion on the side close to the connector. FIG. 21B is a back view showing the portion of the face portion in the vicinity of the corner portion on the side close to the connector in a further enlarged manner. FIG. 21C is a cross-sectional view taken along line C-C in FIG. 21A. FIG. 21D is a perspective view of a portion of the cable from which a cover is removed.

As shown in FIG. 21A and FIG. 21B, the cables L1 to L7 are introduced into the cable path 365 in a state of being arranged parallel to each other on the same plane, and the cables L1 to L7 are arranged along a side of the opening portion 303 which is close to the connector 331. The cables do not overlap with each other in the thickness direction of the face portion 312. Accordingly, a thickness of the face portion 312 and a thickness of the front panel 300 can be suppressed.

As shown in FIG. 21A and FIG. 21B, the contacts 370, each formed of a conductor, are disposed for the contact regions C1 to C18 along respective sides of the opening portion 303. The contacts 370 are disposed adjacently to the inner seal 361 in a state where the contacts 370 are not brought into contact with the inner seal 361. The contacts 370 are disposed on the seal holder 363, and are fixed to the seal holder by the plurality of screws 511. Wiring grooves 363*a*, into which the cables are pulled, are formed on the seal holder 363 in the respective contact regions so as to extend from the cable path 365 to connection positions (the positions of the screws 511). As shown in FIG. 21D, the cable L includes: a core wire or a conductive wire 601 formed of an electrical conductor; and a cover 602 for providing insulation to the conductive wire 601. The cover 602 is removed from a distal end portion (second end portion) of the cable L so that the core wire or the conductive wire 601 is exposed. The core wire 601 of the cable L is pulled in the wiring groove 363*a*. The cable L pulled in the wiring groove 363*a* in the allocated contact region terminates in the allocated contact region.

For example, the contact region C1 has the wiring groove 363a (FIG. 21C) opening toward a portion of the cable path 365 in the vicinity of the contact region C1 in the seal holder 363. The wiring groove 363a extends so as to pass an area below four screws (fastening members) 511 disposed in the contact region C1, and terminates (FIG. 21A). In the same manner, the contact region C2 has the wiring groove 363a opening toward a portion of the cable path 365 in the vicinity of the contact region C2 in the seal holder 363. The wiring groove 363a extends so as to pass an area below four screws 511 disposed in the contact region C2, and terminates. The positional relationship between the screw 511 and the wiring groove 363a is shown in FIG. 21C. When the cable L (the cable L1 in FIG. 21C) is arranged in the wiring groove 363a, the contact 370 and the cable (core wire) are pressed by a flange portion 511a of the screw 511.

An electrical connection between the cable L and the contact 370 in each contact region is performed as follows. The description is made by taking the cable L1 as an example. The cover 602 is removed from the distal end portion (second end portion) of the cable L1 so that the core wire (conductive wire) 601 is exposed (FIG. 21A to FIG. 21D). The distal end portion of the cable L1 is introduced into the wiring groove 363a of the seal holder 363 in the vicinity of the contact region C1, and is pressed together with the contact 370 by four screws (fastening members) 511 within the contact region C1. That is, the screws (fastening members) 511 and the seal holder 363 sandwich the core wire 601 of the cable L1 together with the contact 370. As a result, as shown in FIG. 21C, the cable L1 is electrically connected to the contact 370. When the substrate holder 1 holds the substrate S, the contact 370 is brought into contact with the substrate S so that power is supplied to the substrate S from the external power source through the cable L1 and the contact 370. Other contact regions C2 to C18 have the same configuration. As a result, power is supplied to the substrate S through eighteen contacts 370.

The cables L2 to L7 are not pulled in the contact region C1 so that the cables L2 to L7 are arranged in parallel within a range corresponding to the contact region C1 and the contact region C2. In the contact region C2, in the same manner as the contact region C1, the cable L2 is pulled in the wiring groove 363a of the seal holder 363, and is pressed together with the contact 370 by four screws 511 so that the cable L2 is electrically connected with the contact 370. As a result, the cables L3 to L7 are arranged in parallel within a range corresponding to the contact region C2 and the contact region C3. In the same manner, the cables L3 to L7 are electrically connected with the contacts 370 in the contact regions C3 to C7 respectively. As a result, the cables L4 to L7 are arranged in parallel within a range corresponding to the contact region C3 and the contact region C4. The cables L5 to L7 are arranged in parallel within a range corresponding to the contact region C4 and the contact region C5. The cables L6 and L7 are arranged in parallel within a range corresponding to the contact region C5 and the contact region C6. The cable L7 is arranged in parallel within a range corresponding to the contact region C6 and the contact region C7.

In the same manner, the cables L17, L18 are electrically connected with the contacts 370 in the contact regions C17, C18 respectively. Also in the region (second region) on the side away from the connector, in the same manner as the cables in the first region, the cables L8 to L16 are electrically connected with the contacts 370 in the contact regions C8 to C16 respectively.

In this embodiment, the case has been described where the cable L is sandwiched together with the contact 370, and the cable L and the contact 370 are directly and electrically connected with each other. However, another conductive member (second conductive member) may be interposed between the cable L and the contact 370.

(Advantageous Effects of Embodiment)

According to the substrate holder 1 of this embodiment, the front plate 300 and the back plate 400, which sandwich a substrate therebetween, are fixed with each other by the clamps 340 which are rotatable about shafts extending parallel to the surface of the front plate body 310 or by the clamps 340 which are reciprocable in the direction intersecting with the surface of the front plate body 310. Accordingly, it is possible to suppress or prevent that a force in the rotational direction is applied to the substrate. In the case where a substrate has a large size and a small thickness, when a force in the rotational direction is applied to the substrate, the substrate may be deflected. However, according to the substrate holder 1 of this embodiment, even when the substrate holder 1 holds a substrate having a large size and a small thickness, deflection of the substrate can be suppressed or prevented.

The clamps 340 are of a normally-closed type. Accordingly, the clamps are only opened in bringing the back plate body 410 into contact with the front plate body 310, and it is unnecessary to apply an external force to the clamps by actuators or the like when the clamps are in a clamping state. For this reason, energy consumption can be suppressed.

The back plate 400 can be sandwiched by the clamps 340 at a plurality of places, and the operations of the respective clamps 340 are synchronized by the connecting member (rotary shaft 341). Accordingly, the clamps can be effectively operated. Further, the configuration of the actuators AR1, which apply an external force to the clamps, can be simplified. The levers 342 can operate the respective clamps 340 by way of the rotary shafts 341 upon reception of an external force from the first actuators AR1 and hence, fixing of the substrate by the clamps 340 can be easily automated.

The engagement receiving portions 430, each having a shape which receives the engaging portion 340a of the clamp 340, are formed on the back plate 400 and hence, the engagement of the clamps with the back plate 400 can be enhanced. By adopting the configuration where the engagement receiving portions 430, which are formed as separate bodies from the back plate body 410, are attached to the back plate body 410, a size, a shape, the number or the like of the engagement receiving portion 430 can be suitably and easily selected.

A substrate is fixed to the back plate 400 by the clips 421, which are rotatable about the shafts 424 extending parallel to the surface of the back plate body 410, or by the clips 421, which are reciprocable in the direction intersecting with the surface of the back plate body 410. Accordingly, it is possible to suppress or prevent that a force in the rotational direction is applied to the substrate. In the case where a substrate has a large size and a small thickness, when a force in the rotational direction is applied to the substrate, the substrate may be deflected. However, according to the substrate holder of this embodiment, even when the substrate holder holds a substrate having a large size and a small thickness, deflection of the substrate can be suppressed or prevented.

The clips 421 are of a normally-closed type. Accordingly, the clips 421 are only opened in bringing a substrate into contact with the back plate body 410, and it is unnecessary to apply an external force to the clips 421 by actuators or the like when the clips 421 are in a clipping state. For this reason, energy consumption can be suppressed.

The buttons 470, which receive a force from a surface on a side opposite to a surface brought into contact with a substrate, is provided. Accordingly, the actuators AR2 can be disposed on a side opposite to the surface which is brought into contact with the substrate and hence, the movement and a change in posture of the back plate 400 can be easily performed after the substrate is fixed.

The buttons 470 can operate the clips 421 upon reception of an external force from the second actuators AR2. With such a configuration, fixing of the substrate by the clips 421 can be easily automated.

The seal holder 363 for holding the inner seal 361 and the seal holder 364 for holding the outer seal 362 are formed as separate bodies and hence, the respective seals can be replaced individually.

In the substrate holder of this embodiment, the cover 602 is removed from one end portion of the cable L, and the core wire 601 of the cable L is sandwiched together with the contact 370. With such a simple configuration, an electrical connection between the cable L and the contact 370 can be established. That is, the cable L and the contact 370 can be connected with each other without providing a connector or the like to an end portion of the cable. When power is supplied to the substrate S in a state where the contacts 370 are brought into contact with the substrate S at a plurality of places, it is necessary to draw a plurality of cables L in the substrate holder so as to establish an electrical connection. According to the substrate holder of this embodiment, an electrical connection between the cables L and the contacts 370 can be established with a simple configuration and hence, an increase in size of the substrate holder can be suppressed. When power is supplied to a substrate having a large size and/or when a value of electric current supplied to a substrate is large, the number of cables is increased and/or a diameter of the cables is increased. In such a case, for example, the substrate holder of this embodiment can be effectively used where the cables can be connected in a simple manner.

In the substrate holder of this embodiment, an electrical connection between the cable L and the contact 370 can be established with a simple configuration and a simple operation using the fastening members 511 such as bolts or screws.

In the substrate holder of this embodiment, the cable L and the contact 370 can be sandwiched using the seal holder 363. Accordingly, the existing configuration can be used and hence, an increase in size of the substrate holder and an increase in cost can be suppressed.

In the substrate holder of this embodiment, the seal holder 363 for the seal 361 and the seal holder 364 for the seal 362 are formed of separate bodies and hence, the seal can be replaced individually. The seal holder 363 and the seal holder 364 can be also easily replaced individually.

In the substrate holder of this embodiment, the cables L are arranged so as not to overlap with each other in the thickness direction of the substrate holder and hence, an increase in thickness of the substrate holder can be suppressed. Particularly, when a substrate has a large size and/or when an amount of electric current is large, there is a possibility that the number of cables and/or a diameter of the cables increase. According to the configuration of this embodiment, an increase in size of the substrate holder in the thickness direction can be suppressed.

In the substrate holder of this embodiment, the respective cables L, where the cover 602 is removed from the distal end of each cable L, are sequentially pulled into positions of the respective contacts 370, and are connected to the respective contacts 370. Accordingly, insulation can be established between the cables up to the connection positions and, at the same time, the cables can be connected to the conductive members with a simple configuration.

When the substrate holder of this embodiment is used in a plating apparatus, an increase in size of the substrate holder can be suppressed so that an increase in size of the plating apparatus can be also suppressed.

In a method for manufacturing the substrate holder of this embodiment, the cover 602 is removed from one end portion of the cable L, and the core wire 601 of the cable L is sandwiched together with the contact 370. Accordingly, an electrical connection between the cable L and the contact 370 can be established with a simple configuration. That is, the cable L and the contact 370 can be connected with each other without providing a connector or the like to an end portion of the cable. When power is supplied to the substrate S in a state where the contacts 370 are brought into contact with the substrate S at a plurality of places, it is necessary to draw a plurality of cables L in the substrate holder so as to establish an electrical connection. According to the substrate holder of this embodiment, an electrical connection between the cables L and the contacts 370 can be established with a simple configuration and hence, an increase in size of the substrate holder can be suppressed. When power is supplied to a substrate having a large size and/or when a value of electric current supplied to a substrate is large, the number of cables is increased and/or a diameter of the cables is increased. In such a case, for example, the substrate holder of this embodiment can be effectively used where the cables can be connected in a simple manner.

In performing plating treatment on a substrate using the above-mentioned substrate holder 1, even when power is supplied to a substrate having a large size or even when a value of electric current supplied to a substrate is large, an electrical connection between the cables and the conductive members in the substrate holder is established with a simple configuration. Accordingly, plating treatment can be performing using the substrate holder where an increase in size of the substrate holder is suppressed or prevented.

In the above-mentioned embodiment, before plating treatment is performed, conduction confirmation processing is performed, where electrical resistance between the contact on the first side and the contact on the second side of each pair of the external connection contacts is measured so as to confirm whether or not there is a variation in electrical resistance between the plurality of pairs of the external connection contacts. Accordingly, it is possible to perform plating treatment after it is confirmed in advance that there is no problem in uniformity in plating film thickness caused by variation in electrical resistance between the plurality of pairs of the external connection contacts. As a result, reliability of plating treatment can be enhanced.

[1] The substrate holder according to one aspect of the present invention includes a first holding member and a second holding member configured to sandwich and fix a substrate, wherein the first holding member includes a first holding member body, and a clamp provided on the first holding member body, the clamp being rotatable about a shaft extending parallel to a surface of the first holding member body, or being reciprocable in a direction intersecting with the surface of the first holding member body, the second holding member includes a second holding member body, and the clamp is capable of engaging with the second holding member in a state where the first holding member body and the second holding member body are brought into contact with each other, to fix the second holding member to the first holding member.

With this substrate holder, the first holding member and the second holding member, which sandwich a substrate therebetween, are fixed with each other by the clamps which are rotatable about shafts extending parallel to the surface of the first holding member body or by the clamps which are reciprocable in the direction intersecting with the surface of the first holding member body. Accordingly, it is possible to suppress or prevent that a force in the rotational direction is applied to the substrate. Particularly in the case where a substrate has a large size and a small thickness, when a force in the rotational direction is applied to the substrate, the substrate may be deflected. However, according to this substrate holder, even when the substrate holder holds a substrate having a large size and a small thickness, deflection of the substrate can be suppressed or prevented.

[2] In the substrate holder described in [1], the clamp is biased in a closing direction by a first biasing member, and when the second holding member body is brought into contact with the first holding member body with the clamp in an open state, and subsequently the clamp is brought into a closed state, the clamp is capable of fixing the second holding member to the first holding member.

In this configuration, the clamps are of a normally-closed type. Accordingly, the clamps are only opened in bringing the second holding member body into contact with the first holding member body, and it is unnecessary to apply an external force to the clamps by actuators or the like when the clamps are in a clamping state. For this reason, energy consumption can be suppressed.

[3] In the substrate holder described in [1] or [2], the first holding member includes a plurality of the clamps, and the first holding member further includes a connecting member which connects the plurality of clamps with each other, and the connecting member causes the plurality of clamps to be operated in a synchronized manner.

In this configuration, the second holding member can be sandwiched by the clamps at a plurality of places, and the operations of the respective clamps are synchronized by the connecting member. Accordingly, the clamps can be efficiently operated. Further, the plurality of clamps are operated in an interlocking manner by the connecting member so that the configuration of the actuators, which apply an external force to the clamps, can be simplified.

[4] In the substrate holder described in [3], the connecting member is formed of a rotary shaft rotatably attached to the first holding member body.

In this case, forming the connecting member using the rotary shaft allows a simple configuration. Further, the respective clamps can be operated in a synchronized manner with certainty.

[5] The substrate holder described in [3] or [4] further includes a first force receiving portion provided on the connecting member, wherein the connecting member is configured to be operated upon application of a force to the first force receiving portion.

In this case, applying a force to the first force receiving portion with the actuator, for example, causes the respective clamps to be operated by way of an interlocking member and hence, holding of the substrate by the clamps can be easily automated.

[6] In the substrate holder described in any one of [1] to [5], the clamp includes an engaging portion at a distal end, and the second holding member includes an engagement receiving portion having a shape which receives the engaging portion of the clamp.

In this case, the engagement receiving portions, each having a shape which receives the engaging portion of the clamp, are formed on the second holding member and hence, the engagement of the clamps with the second holding member can be enhanced.

[7] In the substrate holder described in [6], the engagement receiving portion is a separate body from the second holding member body, and is attached to the second holding member body.

In this case, by adopting the configuration where the engagement receiving portion, which is formed as a separate body from the second holding member body, is attached to the second holding member body, a size, a shape, the number or the like of the engagement receiving portion can be suitably and easily selected.

[8] The substrate holder described in [1] to [7] may further include a clip for holding the substrate. The substrate is sandwiched by the first and second holding members after the substrate is held by the clips. Accordingly, the substrate can be accurately held with certainty.

[9] In the substrate holder described in [8], the clip is provided on a surface of the second holding member body on a side which is brought into contact with the substrate, and the clip is rotatable about a shaft extending parallel to a surface of the second holding member body, or is reciprocable in a direction intersecting with the surface of the second holding member body.

With this substrate holder, the substrate is fixed to the second holding member by the clips which are rotatable about the shafts extending parallel to the surface of the second holding member body, or by the clips which are reciprocable in the direction intersecting with the surface of the second holding member body. Accordingly, it is possible to suppress or prevent that a force in the direction parallel to the surface of the substrate, such as the rotational direction, is applied to the substrate. Particularly, in the case where a substrate has a large size and a small thickness, when a force in the direction parallel to the surface of the substrate, such as the rotational direction, is applied to the substrate, the substrate may be deflected. However, according to this substrate holder, even when the substrate holder holds a substrate having a large size and a small thickness, deflection of the substrate can be suppressed or prevented. Further, the movement and a change in posture of the second holding member can be easily performed after the substrate is fixed by the clips.

[10] In the substrate holder described in [9], the clip is biased in a closing direction by a second biasing member.

In this configuration, the clips are of a normally-closed type. Accordingly, the clips are only opened in bringing the substrate into contact with the second holding member body, and it is unnecessary to apply an external force to the clips by actuators or the like when the clips are in a clipping state. For this reason, energy consumption can be suppressed.

[11] In the substrate holder described in [10], the second holding member includes a second force receiving portion provided on the second holding member body, the second force receiving portion is configured to be displaceable so as to be brought into contact with the clip upon reception of a force on a surface of the second force receiving portion on a side opposite to a surface to be brought into contact with the substrate, and the clip is configured to open against the second biasing member by being pressed by the second force receiving portion.

In this case, applying a force to the second force receiving portion with an actuator, for example, causes the clips to be operated and hence, fixing of the substrate by the clips can be easily automated. The second holding member body includes the second force receiving portion which receives a force on a surface on a side opposite to a surface to be brought into contact with the substrate. Accordingly, the actuator can be disposed on a side opposite to the surface which is brought into contact with the substrate and hence, the movement and a change in posture of the second holding member can be easily performed after the substrate is fixed.

[12] In the substrate holder described in any one of [1] to [11], the first holding member further includes, on a surface of the first holding member which is brought into contact with the substrate, a first holder which holds a first elastic projecting portion, and a second holder which is a separate body from the first holder, and holds a second elastic projecting portion.

In this case, the holder for holding the first elastic projecting portion and the holder for holding the second elastic projecting portion are formed as separate bodies and hence, the respective elastic projecting portions can be replaced individually.

[13] In the substrate holder described in any one of [1] to [12], the substrate holder includes an arm portion on one end side of the substrate holder.

In this case, the substrate holder can be transported in a state of being vertically suspended by the arm portion. Accordingly, it is possible to suppress or prevent a possibility of damage to a surface of the substrate.

[14] In the substrate holder described in any one of [1] to [13], the substrate holder is configured to hold a substrate having a rectangular shape.

A rectangular substrate having a large size and a small thickness can be held without causing deflection.

[15] The plating apparatus according to one aspect of the present invention includes a substrate holder configured to hold a substrate, and a plating tank configured to receive the substrate holder so as to perform plating treatment on the substrate. The substrate holder includes a first holding member and a second holding member which sandwich and fix the substrate. The first holding member includes a first holding member body, and a clamp provided on the first holding member body, the clamp being rotatable about a shaft extending parallel to a surface of the first holding member body, or being reciprocable in a direction intersecting with the surface of the first holding member body. The second holding member includes a second holding member body. The clamp is engaged with the second holding member so as to press the second holding member toward the first holding member in a state where the first holding member body and the second holding member body are brought into contact with each other.

With this plating apparatus, it is possible to acquire advantageous effects similar to the advantageous effects described previously in [1]. Further, a substrate having a large size and a small thickness can be properly held on the substrate holder and hence, quality of plating can be ensured and improved.

[16] The method for holding a substrate according to one aspect of the present invention includes the steps of: sandwiching the substrate between a first holding member and a second holding member; and fixing the second holding member by a clamp so as to be pressed toward the first holding member, the clamp being rotatable about a shaft extending parallel to a surface of the first holding member, or being reciprocable in a direction intersecting with the surface of the first holding member.

With this method, it is possible to acquire advantageous effects similar to the advantageous effects described previously in [1].

[17] In the method for holding a substrate described in [16], in sandwiching the substrate between the first holding member and the second holding member, the substrate may be placed on the second holding member and be held by a clip, and the substrate may be sandwiched between the first holding member and the second holding member by causing the first holding member and the second holding member to approach each other.

In this case, the substrate is held on the second holding member by the clip and, thereafter, the substrate is sandwiched by the first and second holding members. Accordingly, the movement and a change in posture of the second holding member can be easily performed after the substrate is held by the clips and, at the same time, the substrate can be accurately held with certainty.

[18] The substrate holder according to one aspect of the present invention includes a first holding member and a second holding member configured to sandwich a substrate, wherein the first holding member includes: a first holding member body; at least one cable having one end portion from which a cover is removed; at least one first conductive member configured to be electrically contactable with the substrate; and a sandwiching member provided on the first holding member body, and configured to sandwich the one end portion of the cable together with the first conductive member or a second conductive member which is electrically coupled to the first conductive member.

In this substrate holder, the cover is removed from one end portion of the cable, and the portion of the cable from which the cover is removed is sandwiched together with the conductive member. With such a simple configuration, an electrical connection between the cable and the conductive member can be established. That is, the cable and the conductive member can be connected with each other without providing a connector or the like to an end portion of the cable. When power is supplied to the substrate in a state where the conductive members are brought into contact with the substrate at a plurality of places, it is necessary to draw a plurality of cables in the substrate holder so as to establish an electrical connection. According to this substrate holder, an electrical connection between the cable and the conductive member can be established with a simple configuration and hence, an increase in size of the substrate holder can be suppressed. When power is supplied to a substrate having a large size and/or when the value of electric current to be supplied to a substrate is large, the number of cables is increased and/or the diameter of the cables is increased. In such a case, for example, this substrate holder can be effectively used where the cables can be connected in a simple manner.

[19] In the substrate holder described in [18], the sandwiching member may include: a plate-like member disposed on the first holding member body; and a fastening member which sandwiches the one end portion of the cable together with the first conductive member or a second conductive member which is electrically coupled to the first conductive member in a state where the fastening member is engaged by fastening with or is fitted in the plate-like member.

In this case, an electrical connection between the cable and the conductive member can be established with a simple configuration and a simple operation using the fastening member.

[20] In the substrate holder described in [19], the fastening member may be formed of a bolt or a screw.

An electrical connection between the cable and the conductive member can be established with a simple configuration by the bolt or the screw. Accordingly, an increase in cost can be suppressed.

[21] In the substrate holder described in [19] or [20], the first holding member may further include: a first seal which is provided on the first holding member body so as to provide sealing between the substrate and the first holding member body; and a first seal holder which mounts the first seal on the first holding member body, and the plate-like member is the first seal holder.

In this case, the cable and the conductive member can be sandwiched using the seal holder. Accordingly, the existing configuration can be used and hence, an increase in size of the substrate holder and an increase in cost can be suppressed.

[22] In the substrate holder described in [21], the first holding member body may further include a second seal outward in a radial direction of the first seal, and the cable may be disposed between the first seal and the second seal.

In this case, an electrical connection between the cable and the conductive member can be established within a space sealed by the first and second seals.

[23] In the substrate holder described in [22], the first holding member body may further include a second seal holder which holds the second seal.

In this case, the seal holder for the first seal and the seal holder for the second seal are formed of separate bodies and hence, the seals can be easily replaced individually. The seal holders can be also easily replaced individually.

[24] In the substrate holder described in any one of [18] to [23], it may be configured such that the first holding member includes a plurality of the first conductive members, and a plurality of the cables which are allocated to the respective first conductive members, the respective first conductive members are disposed so as to come into contact with different places on the substrate, and the respective cables are arranged in parallel rows so as not to overlap with each other in a thickness direction of the first holding member, and are configured to terminate at positions of the first conductive members allocated (the corresponding first conductive members).

The cables are arranged so as not to overlap with each other in the thickness direction of the substrate holder and hence, an increase in thickness of the substrate holder can be suppressed. Particularly, when a substrate has a large size and/or when an amount of electric current is large, there is a possibility that the number of cables and/or the diameter of the cables increase. According to this configuration, an increase in size of the substrate holder in the thickness direction can be suppressed.

[25] In the substrate holder described in [24], it may be configured such that the plurality of the cables include first to third cables, the first to third cables are respectively allocated to the first conductive members disposed at first to third positions on the first holding member body, the first to third positions being arranged in this order, the first to third cables respectively terminate at the first to third positions on the first holding member body, and the first to third cables extend in parallel rows on a side of the first position opposite to the third position, the second and third cables extend in parallel rows between the first position and the second position, and the third cable extends between the second position and the third position.

The respective cables, where the cover is removed from the distal end of each cable, are sequentially pulled into positions of the respective conductive members, and are connected to the respective conductive members. Accordingly, insulation can be established between the cables up to the connection positions and, at the same time, the cables can be connected to the conductive members with a simple configuration.

[26] It is possible to provide a plating apparatus including: the substrate holder described in any one of [18] to [25]; and a plating tank configured to receive the substrate holder so as to perform plating treatment on the substrate holder.

When the above-mentioned substrate holder is used in a plating apparatus, an increase in size of the substrate holder can be suppressed so that an increase in size of the plating apparatus can be also suppressed.

[27] The plating apparatus according to one aspect of the present invention includes a substrate holder configured to hold a substrate, and a plating tank configured to receive the substrate holder so as to perform plating treatment on the substrate, wherein the substrate holder includes a first holding member, and the first holding member includes: a first holding member body; at least one cable having one end portion from which a cover is removed; at least one first conductive member configured to be electrically contactable with the substrate; and a sandwiching member provided on the first holding member body, and configured to sandwich the one end portion of the cable together with the first conductive member or a second conductive member which is electrically coupled to the first conductive member.

It is possible to acquire advantageous effects similar to the advantageous effects described previously in [26].

[28] In the plating apparatus described in [27], it may be configured such that the substrate holder includes a first predetermined number of the cables, and a plurality of pairs of external connection contacts, each pair of the external connection contacts includes a contact on a first side and a contact on a second side, a second predetermined number of cables are electrically connected to the contact on the first side and the contact on the second side in a pair of external connection contacts, the second predetermined number being smaller than the first predetermined number and being equal to or more than 2, and the plating apparatus further includes a resistance measuring instrument configured to measure an electrical resistance between the contact on the first side and the contact on the second side of each pair of the external connection contacts.

In this case, before plating treatment is performed, conduction confirmation processing may be performed, where electrical resistance between the contact on the first side and the contact on the second side of each pair of the external connection contacts is measured so as to confirm that there is no variation in electrical resistance between the plurality of pairs of the external connection contacts. Accordingly, it is possible to perform plating treatment after advance confirmation is made that no problems are present in uniformity of plating film thickness caused by variation in electrical resistance between the plurality of pairs of the external connection contacts. As a result, reliability of plating treatment can be enhanced.

[29] The method for manufacturing a substrate holder according to one aspect of the present invention includes the steps of: disposing at least one cable having one end portion from which a cover is removed on a first holding member for holding a substrate; and sandwiching the one end portion of the cable by a sandwiching member together with at least one first conductive member configured to be electrically contactable with the substrate, or a second conductive member which is electrically coupled to the first conductive member, thus establishing an electrical connection between the cable and the first conductive member.

In this method for manufacturing a substrate holder, the cover is removed from one end portion of the cable, and the portion of the cable from which the cover is removed is sandwiched together with the conductive member. Accordingly, an electrical connection between the cable and the conductive member can be established with a simple configuration. That is, the cable and the conductive member can be connected with each other without providing a connector or the like to an end portion of the cable. When power is supplied to the substrate in a state where the conductive members are brought into contact with the substrate at a plurality of places, it is necessary to draw a plurality of cables in the substrate holder so as to establish an electrical connection. According to this substrate holder, an electrical connection between the cable and the conductive member can be established with a simple configuration and hence, an increase in size of the substrate holder can be suppressed. When power is supplied to a substrate having a large size and/or when the value of electric current to be supplied to a substrate is large, the number of cables is increased and/or the diameter of the cables is increased. In such a case, for example, this substrate holder can be effectively used where the cables can be connected in a simple manner.

[30] The plating method according to one aspect of the present invention is a plating method for performing plating treatment on a substrate held by a substrate holder, the method including the steps of: causing the substrate to be held by the substrate holder, the substrate holder including at least one cable having one end portion from which a cover is removed, at least one first conductive member configured to be electrically contactable with the substrate, and a sandwiching member configured to sandwich the one end portion of the cable together with the first conductive member or a second conductive member which is electrically coupled to the first conductive member; and performing plating treatment on the substrate held by the substrate holder while power is supplied to the substrate through the cable.

In this plating method, even when power is supplied to a substrate having a large size and/or even when the value of electric current to be supplied to a substrate is large, an electrical connection between the cable and the conductive member in the substrate holder is established with a simple configuration. Accordingly, plating treatment can be performed using the substrate holder where an increase in size of the substrate holder is suppressed or prevented.

[31] In the plating method described in [30], the substrate holder includes a first predetermined number of the cables, and a plurality of pairs of external connection contacts, each pair of the external connection contacts includes a contact on a first side and a contact on a second side, a second predetermined number of cables are electrically connected to the contact on the first side and the contact on the second side, the second predetermined number being smaller than the first predetermined number and being equal to or more than 2, and the method further includes a step of measuring an electrical resistance of each pair of the external connection contacts by causing a resistance measuring instrument to be brought into contact with the contact on the first side and the contact on the second side of each pair of the external connection contacts.

In this case, before plating treatment is performed, conduction confirmation processing is performed, where electrical resistance between the contact on the first side and the contact on the second side of each pair of the external connection contacts is measured so as to confirm that there is no variation in electrical resistance between the plurality of pairs of the external connection contacts. Accordingly, it is possible to perform plating treatment after advance confirmation is made that no problems are present in uniformity of plating film thickness caused by variation in electrical resistance between the plurality of pairs of the external connection contacts. As a result, reliability of plating treatment can be enhanced.

Although the embodiment of the present invention has been described heretofore based on some examples, the above-mentioned embodiment of the present invention is provided for facilitating the understanding of the present invention, and does not limit the present invention. As a matter of course, without departing from the gist of the present invention, various modifications and variations are conceivable, and the present invention includes a technique equivalent to the present invention. Within a range where at least a portion of the above-mentioned problems can be solved or within a range where at least a portion of the above-mentioned advantageous effects can be acquired, respective constitutional elements described in the claims and the specification may be combined or omitted as desired.

This application claims priority based on Japanese Patent Application No. 2016-175785 filed on Sep. 8, 2016. The entire disclosure, including DESCRIPTION, CLAIMS, DRAWINGS and ABSTRACT, of Japanese Patent Application No. 2016-191003 filed on Sep. 29, 2016 is incorporated herein by reference.

The entire disclosure, including DESCRIPTION, CLAIMS, DRAWINGS and ABSTRACT, of Japanese Patent Laid-Open No. 2016-117917 (PTL 1), Japanese Patent No. 4179707 (PTL 2), Japanese Patent Laid-Open No. 2009-270167 (PTL 3), and Japanese Patent Laid-Open No. 2016-117917 (PTL 4) is incorporated herein by reference.

REFERENCE SIGNS LIST 1 substrate holder
25 cassette table
25a cassette
27 substrate transferring device
28 traveling mechanism
29 substrate loading and unloading mechanism
30 stocker
32 pre-wetting tank
33 presoaking tank
34 pre-rinse tank
35 blow tank
36 rinse tank
37 substrate holder transporting device
38 overflow tank
39 plating tank
50 cleaning device
50a cleaning part
100 plating apparatus
110 loading/unloading part
120 treatment part
120A pretreatment and post-treatment part
120B plating treatment part
175 controller
175A CPU
175B memory
175C control part
300 front plate 301 front surface
302 back surface
303 opening portion
310 front plate body
311 wiring buffer portion
311a wiring hole
312 face portion
313 thick wall portion
320 mounting portion
330 arm portion
331 connector
340 clamp
340a engaging portion
342 lever
350 fixing member
361 inner seal
362 outer seal
363 seal holder
363a wiring groove
364 seal holder
365 cable path
370 contact
390 position alignment pin
400 back plate
401 front surface
402 back surface
410 back plate body
420 clip portion
421 clip
421a pawl portion
421b elongated hole
421c circular hole
422 coil spring
422a leg portion
422b leg portion
422c wound portion
423 fixed portion
423a restricting surface
423b guide surface
424 fixed shaft
430 engagement receiving portion
430a projecting portion
470 button
471 force receiving portion
472 elastic portion
473 mounting portion
474 pressing member
475 fastening member
490 position alignment piece
601 conductive wire
602 cover

The invention claimed is:

1. A substrate holder comprising a first holding member and a second holding member configured to sandwich and fix a substrate, wherein
the second holding member includes a second holding member body, the first holding member includes a first holding member body, and a clamp provided on the first holding member body, the clamp being rotatable about a shaft extending parallel to a surface to be plated of the substrate in a state where the first holding member body and the second holding member body are brought into contact with each other and sandwich the substrate, or being reciprocable in a direction intersecting with the surface to be plated of the substrate in a state where the first holding member body and the second holding member body are brought into contact with each other and sandwich the substrate, and
the clamp is capable of engaging with the second holding member in a state where the first holding member body and the second holding member body are brought into contact with each other, to fix the second holding member to the first holding member.

2. The substrate holder according to claim 1, wherein
the clamp is biased in a closing direction by a first biasing member, and
when the second holding member body is brought into contact with the first holding member body with the clamp in an open state, and subsequently the clamp is brought into a closed state, the clamp is capable of fixing the second holding member to the first holding member.

3. The substrate holder according to claim 1, wherein
the first holding member includes a plurality of the clamps, and the first holding member further includes a connecting member which connects the plurality of clamps with each other, and
the connecting member causes the plurality of clamps to be operated in a synchronized manner.

4. The substrate holder according to claim 3, wherein
the connecting member is formed of a rotary shaft rotatably attached to the first holding member body.

5. The substrate holder according to claim 3 further comprising a first force receiving portion provided in the connecting member, wherein
the connecting member is configured to be operated upon application of a force to the first force receiving portion.

6. The substrate holder according to claim 1, wherein
the clamp includes an engaging portion at a distal end, and
the second holding member includes an engagement receiving portion having a shape which receives the engaging portion of the clamp.

7. The substrate holder according to claim 6, wherein
the engagement receiving portion is a separate body from the second holding member body, and is attached to the second holding member body.

8. The substrate holder according to claim 1 further comprising a clip for holding the substrate.

9. The substrate holder according to claim 8, wherein
the clip is provided on the second holding member on a surface of the second holding member body on a side which is brought into contact with the substrate, and the clip is rotatable about a shaft extending parallel to a surface of the second holding member body, or is reciprocable in a direction intersecting with the surface of the second holding member body.

10. The substrate holder according to claim 9, wherein the clip is biased in a closing direction by a second biasing member.

11. The substrate holder according to claim 10, wherein
the second holding member includes a second force receiving portion provided on the second holding member body,
the second force receiving portion is configured to be displaceable so as to be brought into contact with the clip upon reception of a force on a surface of the second force receiving portion on a side opposite to a surface to be brought into contact with the substrate, and
the clip is configured to open against the second biasing member by being pressed by the second force receiving portion.

12. The substrate holder according to claim 1, wherein
the first holding member further includes, on a surface of the first holding member which is brought into contact with the substrate, a first holder which holds a first elastic projecting portion, and a second holder which is a separate body from the first holder, and holds a second elastic projecting portion.

13. The substrate holder according to claim 1, wherein the substrate holder includes an arm portion on one end side of the substrate holder.

14. The substrate holder according to claim 1, wherein the substrate holder is configured to hold a substrate having a rectangular shape, and
the first holding member includes one or more of the clamps per one side of the substrate having the rectangular shape.

15. A plating apparatus comprising:
a substrate holder configured to hold a substrate; and
a plating tank configured to receive the substrate holder so as to perform plating treatment on the substrate, wherein
the substrate holder includes a first holding member and a second holding member which sandwich and fix the substrate,
the second holding member includes a second holding member body, the first holding member includes a first holding member body, and a clamp provided on the first holding member body, the clamp being rotatable about a shaft extending parallel to a surface to be plated of the substrate in a state where the first holding member body and the second holding member body are brought into contact with each other and sandwich the substrate, or being reciprocable in a direction intersecting with the surface to be plated of the substrate in a state where the first holding member body and the second holding member body are brought into contact with each other and sandwich the substrate, and
the clamp is capable of engaging with the second holding member in a state where the first holding member body and the second holding member body are brought into contact with each other, to fix the second holding member to the first holding member.

16. A method for holding a substrate, the method comprising the steps of:
sandwiching a substrate between a first holding member having a first holding member body and a second holding member having a second holding member body, and
fixing the second holding member by a clamp so as to be pressed toward the first holding member, the clamp being rotatable about a shaft extending parallel to a surface to be plated of the substrate in a state where the first holding member body and the second holding member body are brought into contact with each other and sandwich the substrate, or being reciprocable in a direction intersecting with the surface of to be plated of the substrate in a state where the first holding member body and the second holding member body are brought into contact with each other and sandwich the substrate.

17. The method for holding a substrate according to claim 16, wherein
in sandwiching the substrate between the first holding member and the second holding member,
the substrate is placed on the second holding member and is held by a clip, and the substrate is sandwiched between the first holding member and the second holding member by causing the first holding member and the second holding member to approach each other.

18. A substrate holder comprising a first holding member and a second holding member configured to sandwich a substrate, wherein
the first holding member includes:
a first holding member body including an opening portion configured to expose a surface to be plated of the substrate;
at least one cable having one end portion from which a cover is removed;
at least one first conductive member disposed in the first holding member body around the opening portion and configured to contact the substrate; and
a sandwiching member provided on the first holding member body, and configured to sandwich said one end portion of the cable together with the first conductive member or a second conductive member which is disposed in the first holding member body and is electrically coupled to the first conductive member.

19. The substrate holder according to claim 18, wherein the sandwiching member includes:
a plate-like member disposed on the first holding member body; and
a fastening member which sandwiches said one end portion of the cable together with the first conductive member or a second conductive member which is electrically coupled to the first conductive member in a state where the fastening member is engaged by fastening with or is fitted in the plate-like member.

20. The substrate holder according to claim 19, wherein the fastening member is formed of a bolt or a screw.

21. The substrate holder according to claim 19, wherein the first holding member further includes:
a first seal which is provided on the first holding member body so as to provide sealing between the substrate and the first holding member body; and
a first seal holder which mounts the first seal on the first holding member body, and
the plate-like member is the first seal holder.

22. The substrate holder according to claim 21, wherein the first holding member body further includes a second seal outward in a radial direction of the first seal, and
the cable is disposed between the first seal and the second seal.

23. The substrate holder according to claim 22, wherein the first holding member body further includes a second seal holder which holds the second seal.

24. The substrate holder according to claim 18, wherein the first holding member includes a plurality of the first conductive members, and a plurality of the cables which are allocated to the respective first conductive members,
the respective first conductive members are disposed so as to come into contact with different places on the substrate, and
the respective cables are arranged in parallel rows so as not to overlap with each other in a thickness direction of the first holding member, and are configured to terminate at positions of the first conductive members allocated.

25. The substrate holder according to claim 24, wherein the plurality of the cables include first to third cables,
the first to third cables are respectively allocated to the first conductive members disposed at first to third positions on the first holding member body, the first to third positions being arranged in this order, the first to third cables respectively terminate at the first to third positions on the first holding member body, and the first to third cables extend in parallel rows on a side of the first position opposite to the third position, the second and third cables extend in parallel rows between the first position and the second position, and the third cable extends between the second position and the third position.

26. A plating apparatus comprising:

the substrate holder described in claim 18; and a plating tank configured to receive the substrate holder so as to perform plating treatment on the substrate.

27. A plating apparatus comprising:

a substrate holder configured to hold a substrate; and a plating tank configured to receive the substrate holder so as to perform plating treatment on the substrate, wherein the substrate holder includes a first holding member, and the first holding member includes:
- a first holding member body including an opening portion configured to expose a surface to be plated of the substrate;
- at least one cable having one end portion from which a cover is removed;
- at least one first conductive member disposed in the first holding member around the opening portion and configured to contact the substrate; and
- a sandwiching member provided on the first holding member body, and configured to sandwich said one end portion of the cable together with the first conductive member or a second conductive member which is provided in the first holding member and is electrically coupled to the first conductive member.

28. The plating apparatus according to claim 27, wherein the substrate holder includes a first predetermined number of the cables, and a plurality of pairs of external connection contacts, each pair of the external connection contacts includes one or more contacts on a first side and one or more contacts on a second side, a second predetermined number of cables are electrically connected to the one or more contacts on the first side and the one or more contacts on the second side in a pair of external connection contacts, the second predetermined number being smaller than the first predetermined number and being equal to or more than 2, and the plating apparatus further comprises a resistance measuring instrument configured to measure an electrical resistance between the one or more contacts on the first side and the one or more contacts on the second side of each pair of the external connection contacts.

29. A method for manufacturing a substrate holder for holding a substrate, the method comprising the steps of:

disposing at least one cable having one end portion from which a cover is removed on a first holding member for holding the substrate; and sandwiching said one end portion of the cable by a sandwiching member together with at least one first conductive member disposed in the first holding member around an opening portion in the first holding member to expose a surface to be plated of the substrate and configured to be electrically contactable with the substrate, or a second conductive member which is disposed in the first holding member and is electrically coupled to the first conductive member, thus establishing an electrical connection between the cable and the first conductive member.

* * * * *